(12) United States Patent
Pai et al.

(10) Patent No.: US 11,758,740 B2
(45) Date of Patent: Sep. 12, 2023

(54) THREE-DIMENSIONAL SEMICONDUCTOR DEVICE AND METHOD OF FABRICATING THE SAME

(71) Applicant: Winbond Electronics Corp., Taichung (TW)

(72) Inventors: Chang-Tsung Pai, Taichung (TW); Chiung-Lin Hsu, Taichung (TW); Yu-Ting Chen, Taichung (TW); Ming-Che Lin, Taichung (TW); Chi-Ching Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 361 days.

(21) Appl. No.: 17/224,152

(22) Filed: Apr. 7, 2021

(65) Prior Publication Data
US 2021/0366986 A1    Nov. 25, 2021

(30) Foreign Application Priority Data
May 20, 2020  (TW) ................. 109116733

(51) Int. Cl.
*H10B 63/00* (2023.01)
*H10N 70/00* (2023.01)
*H10N 70/20* (2023.01)

(52) U.S. Cl.
CPC ........... *H10B 63/30* (2023.02); *H10N 70/011* (2023.02); *H10N 70/253* (2023.02); *H10N 70/8265* (2023.02); *H10N 70/841* (2023.02)

(58) Field of Classification Search
CPC .................................................. H10B 63/00
See application file for complete search history.

(56) References Cited

U.S. PATENT DOCUMENTS

| 2005/0161744 A1 | 7/2005 | Frapreau et al. |
| 2006/0273298 A1 | 12/2006 | Petti |
| 2010/0295123 A1 | 11/2010 | Lung et al. |

(Continued)

FOREIGN PATENT DOCUMENTS

| WO | 2018004650 | 1/2018 |

OTHER PUBLICATIONS

"Office Action of Taiwan Counterpart Application", dated Feb. 4, 2021, p. 1-p. 6.

(Continued)

*Primary Examiner* — Marvin Payen
(74) *Attorney, Agent, or Firm* — JCIPRNET

(57) ABSTRACT

A three-dimensional semiconductor device includes multiple semiconductor device layers on a substrate, wherein each layer includes a first stacked structure, a first gate dielectric layer, a first semiconductor layer, a first channel layer, a first source region, a first drain region, and a first resistive random access memory cell. The first stacked structure on the substrate includes a first insulating layer and a first gate conductor layer. The first gate dielectric layer surrounds a sidewall of the first stacked structure. The first semiconductor layer surrounds a sidewall of the first gate dielectric layer. The first channel layer is in the first semiconductor layer. The first source region and the first drain region are on both sides of the first channel layer in the first semiconductor layer. The first resistive random access memory cell is on a first sidewall of the first semiconductor layer and connected to the first drain region.

14 Claims, 26 Drawing Sheets

(56) References Cited

U.S. PATENT DOCUMENTS

2011/0017971 A1    1/2011   Kim et al.
2015/0214276 A1    7/2015   Chang et al.
2015/0263073 A1    9/2015   Lin
2016/0351625 A1   12/2016   Gee et al.
2017/0025175 A1    1/2017   Wang

OTHER PUBLICATIONS

"Office Action of China Counterpart Application", dated May 12, 2023, p. 1-p. 7.

THREE-DIMENSIONAL SEMICONDUCTOR DEVICE AND METHOD OF FABRICATING THE SAME

CROSS-REFERENCE TO RELATED APPLICATION

This application claims the priority benefit of Taiwan application serial no. 109116733, filed on May 20, 2020. The entirety of the above-mentioned patent application is hereby incorporated by reference herein and made a part of this specification.

BACKGROUND

Technical Field

This disclosure relates to an integrated circuit and a fabricating method thereof, and in particular to a three-dimensional semiconductor device and a method of fabricating the same.

Description of Related Art

In recent years, the development of resistive memory such as the resistive random access memory (RRAM) has been extremely rapid, and it is the most promising future memory structure. Resistive memory has the potential advantages of low power consumption, high operating speed, high density, and compatibility with complementary metal oxide semiconductor (CMOS) process technology, therefore making it suitable as a next generation non-volatile memory device.

With the advancement of technology, all electronic products are aiming at high speed and high efficiency, while remaining thin, lightweight and small. The optimization of the chip area and the increase in the yield are the important issues to address currently. Although the RRAM with the structure of one transistor and multiple memory cells (1TnR) optimizes the usage of the limited area, the problem of sneak path remains an urgent problem.

SUMMARY

An embodiment of the disclosure provides a three-dimensional semiconductor device and a method of fabricating the same, which has a stack of multiple semiconductor device layers that effectively uses the wafer area and solves the problem of sneak paths.

An embodiment of the disclosure provides a three-dimensional semiconductor device, which includes multiple semiconductor device layers on a substrate, wherein each of the semiconductor device layers includes a first stacked structure, a first gate dielectric layer, a first semiconductor layer, a first channel layer, a first source region, a first drain region, and a first resistive random access memory cell. The first stacked structure is on the substrate, and the first stacked structure includes a first insulating layer and a first gate conductor layer. The first gate dielectric layer surrounds a sidewall of the first stacked structure. The first semiconductor layer surrounds a sidewall of the first gate dielectric layer. The first channel layer is in the first semiconductor layer. The first source region and the first drain region are on both sides of the first channel layer in the first semiconductor layer. The first resistive random access memory cell is on a first sidewall of the first semiconductor layer and is connected to the first drain region.

An embodiment of the disclosure further provides a method of fabricating a three-dimensional semiconductor device, including forming multiple semiconductor device layers on a substrate, wherein forming each of the semiconductor device layers includes the following steps. A first stacked structure including a first insulating layer and a first gate conductor layer is formed on the substrate. A first gate dielectric layer is formed to surround a sidewall of the first stacked structure. A first semiconductor layer is formed to surround a sidewall of the first gate dielectric layer. A first source region and a first drain region are formed in the first semiconductor layer, wherein a first channel layer is defined as between the first source region and the first drain region. A first RRAM cell is formed on a first sidewall of the first semiconductor layer and is connected to the first drain region.

Based on the above, the three-dimensional semiconductor device illustrated by an embodiment of the disclosure has a stack of multiple semiconductor device layers, and each conductor device layer has multiple transistors with vertical channels and multiple RRAMs disposed beside the sidewalls of the gate structure, allowing the fabrication of tightly stacked memory elements within the limited wafer area. Moreover, the memory element is a memory cell (1T1R), therefore avoiding the problem of sneak path.

DESCRIPTION OF THE EMBODIMENTS

Figure 1A:
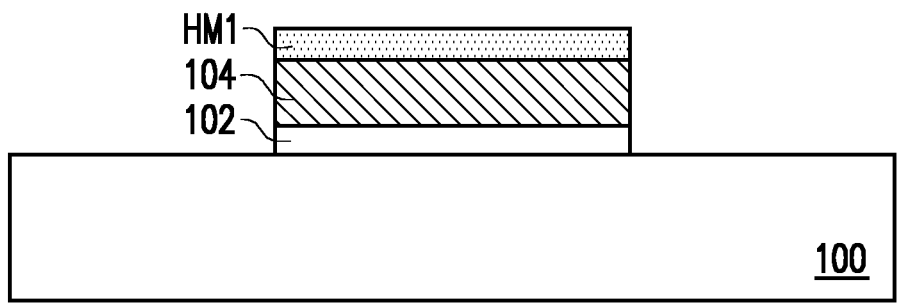
FIGS. 1A to 1M are cross-sectional views taken along the line A-A' in FIGS. 5A to 5E.

With reference to FIG. 1A, an insulating layer 102, a gate conductor layer 104, and a hard mask layer HM1 are formed on a substrate 100, and are patterned into a plurality of stacked structures SK1 by undergoing a lithography and etching processes. The substrate 100 may be a semiconductor and is, for example, silicon. The insulating layer 102 is, for example, silicon oxide. The gate conductor layer 104 is, for example, N-type doped polysilicon. The N-type dopants mentioned here and subsequently are, for example, phosphorus or arsenic. The materials of the hard mask layer HM1 and hard mask layers HM2 to HM7 to be described later are, for example, SiO$_2$, SiN, SiCN, SiON, diamond-like carbon (DLC), highly selective and transparent film (HST) such as carbon base material, etc. The hard mask layers HM1 to HM7 may be identical to or different from each other. Each stacked structure SK1 is, for example, rectangular; multiple stacked structures SK1 are, for example, arranged in a matrix including multiple columns and multiple rows, as shown in FIGS. 5A and 5B.

Figure 1B:
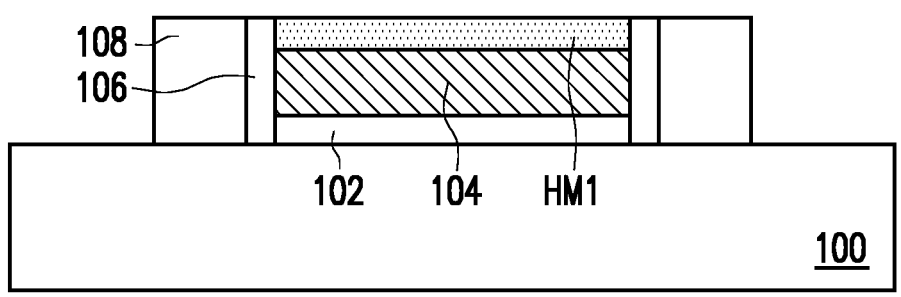
Figure 5A:
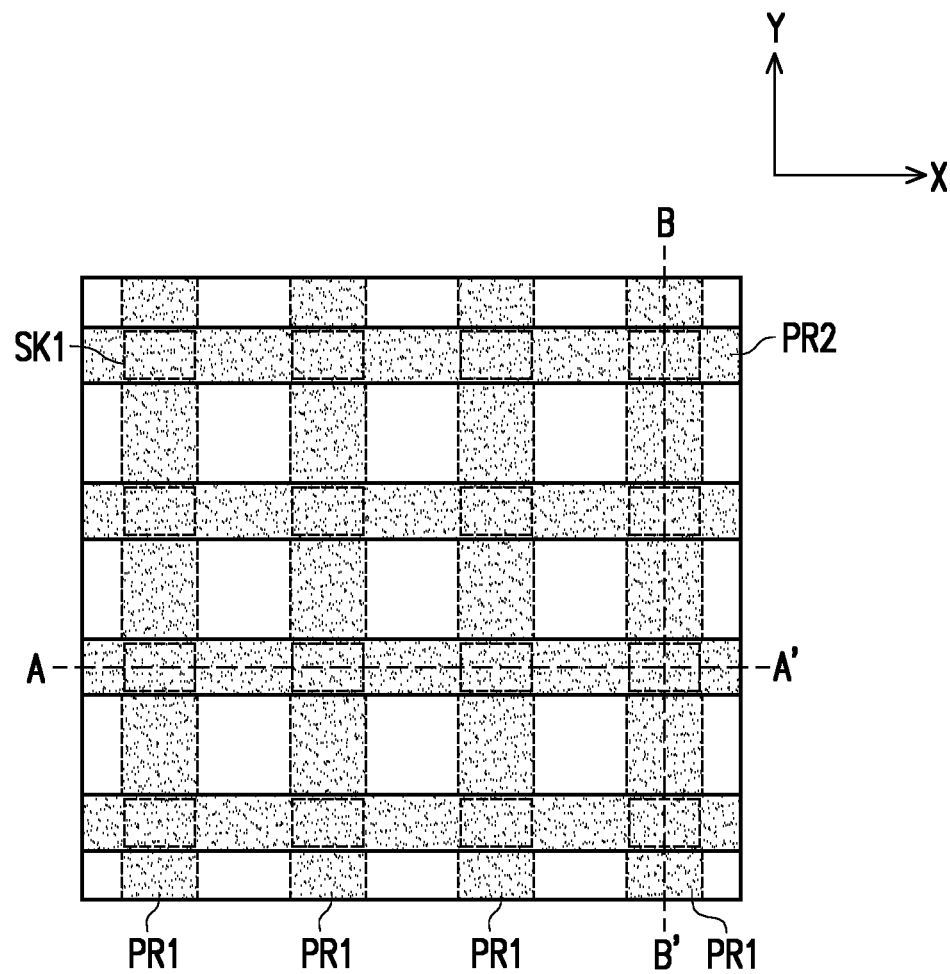
FIGS. 5A to 5E are top views of a fabricating process of a part of a first semiconductor device layer of a three-dimensional semiconductor device according to an embodiment of the disclosure.
Figure 5B:
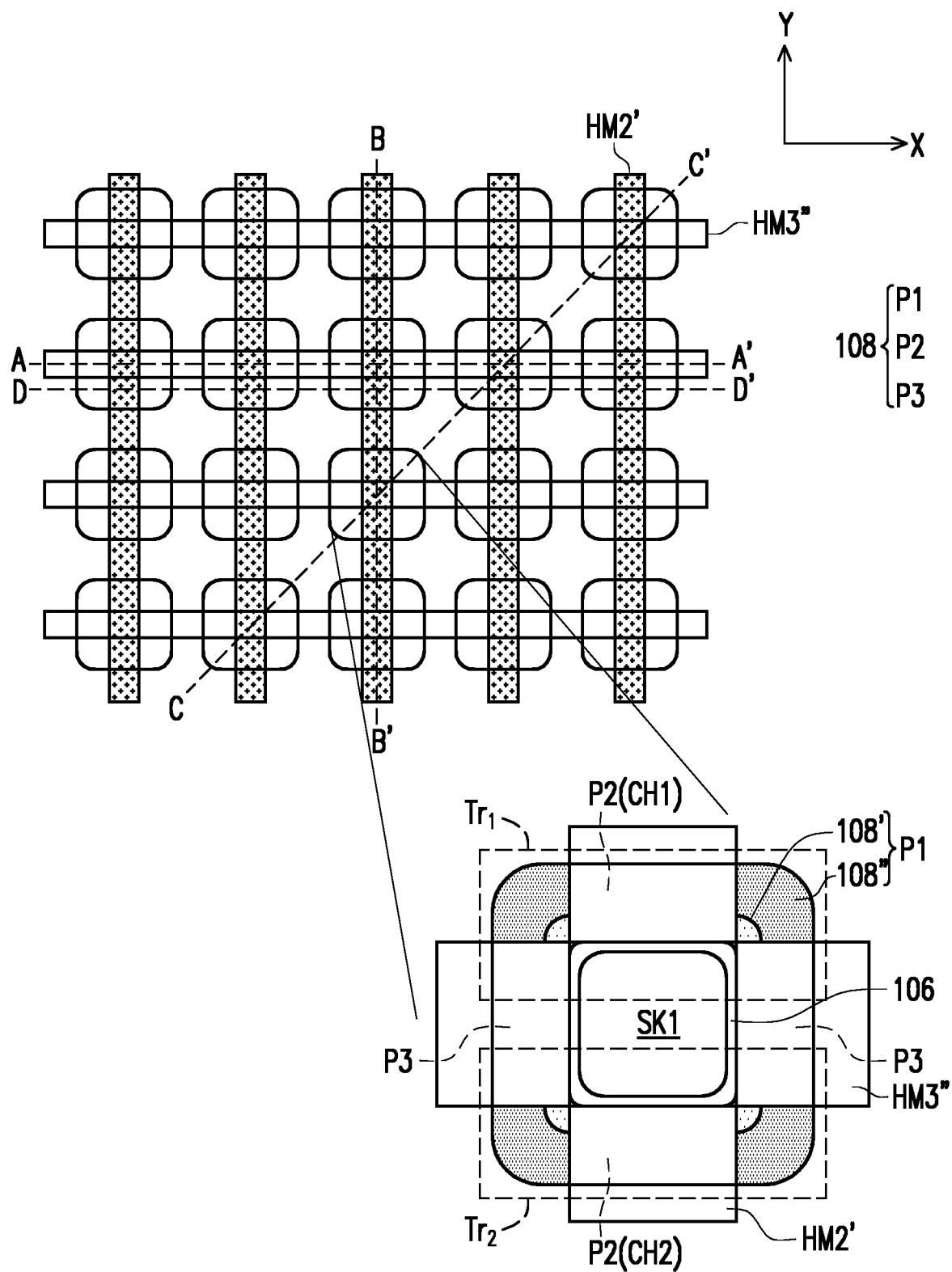

With reference to FIGS. 1B and 5B, a gate dielectric layer 106 is formed on the sidewall of the stacked structure SK1, and a semiconductor layer 108 surrounding the stacked structure SK1 is formed on the sidewall of the gate dielectric layer 106. The gate dielectric layer 106 and the semiconductor layer 108 may be formed by subjecting a dielectric material layer (such as silicon oxide) that is formed on the substrate 100 to an anisotropic etching process, and then depositing, for example, a P-type doped polysilicon semiconductor material layer and then undergoing an anisotropic etching process. The P-type dopant is, for example, boron or boron trifluoride.

Figure 1C:
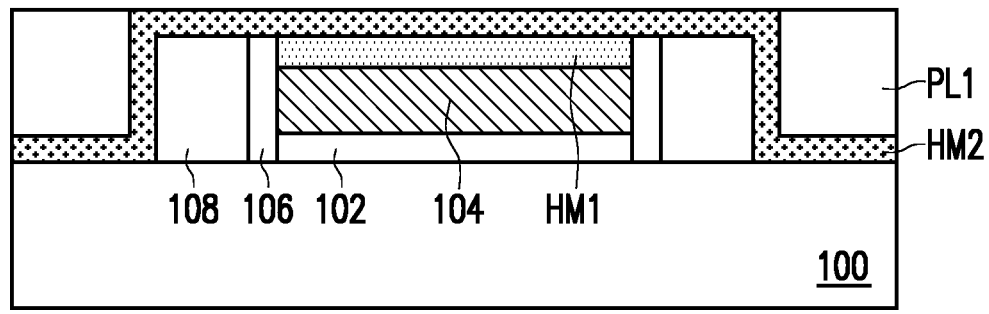

With reference to FIG. 1C, a hard mask layer HM2 is formed on the substrate 100, and a flat layer PL1 is formed in recessed regions on the surface of the hard mask layer HM2 to ensure that the surface of the hard mask layer HM2 and the surface of the flat layer PL1 are substantially coplanar. The flat layer PL1 and flat layers PL2 to PL5 to be described later are, for example, spin-on glass (SOG) or spin-on carbon (SOC). The flat layers PL1 to PL5 may be identical to or different from each other.

Figure 1D:
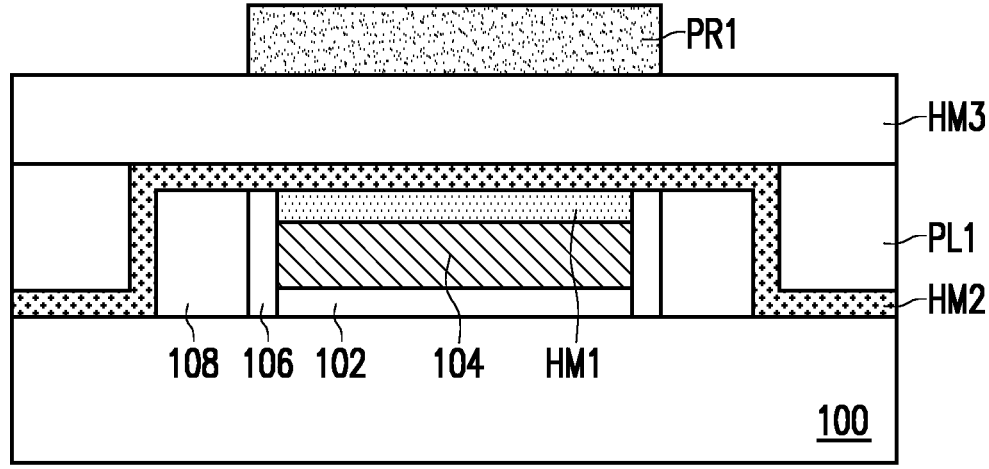

With reference to FIGS. 1D and 5A, a hard mask layer HM3 is formed on the hard mask layer HM2 and the flat layer PL1. Next, a photoresist pattern PR1 is formed on the hard mask layer HM3. The photoresist pattern PR1 includes a plurality of elongated strip-shaped patterns extending along the Y direction and arranged side by side along the X direction. Each elongated strip-shaped pattern covers multiple corresponding stacked structures SK1 below.

Figure 1E:
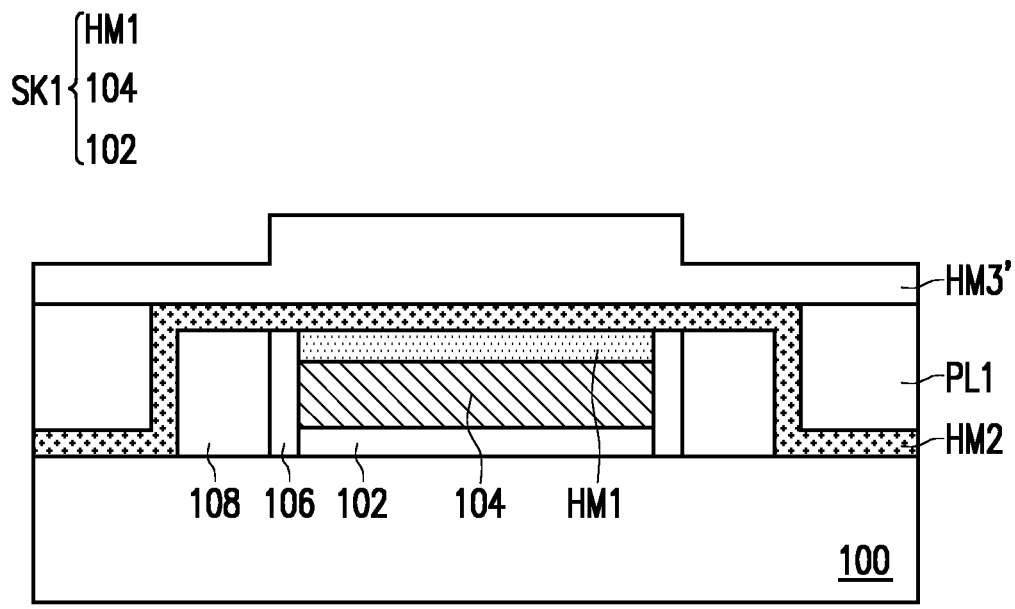

With reference to FIG. 1E, using the photoresist pattern PR1 as a mask, the hard mask layer HM3 is patterned to become a hard mask layer HM3' via the anisotropic etching process. Thereafter, the photoresist pattern PR1 is removed.

Figure 1F:
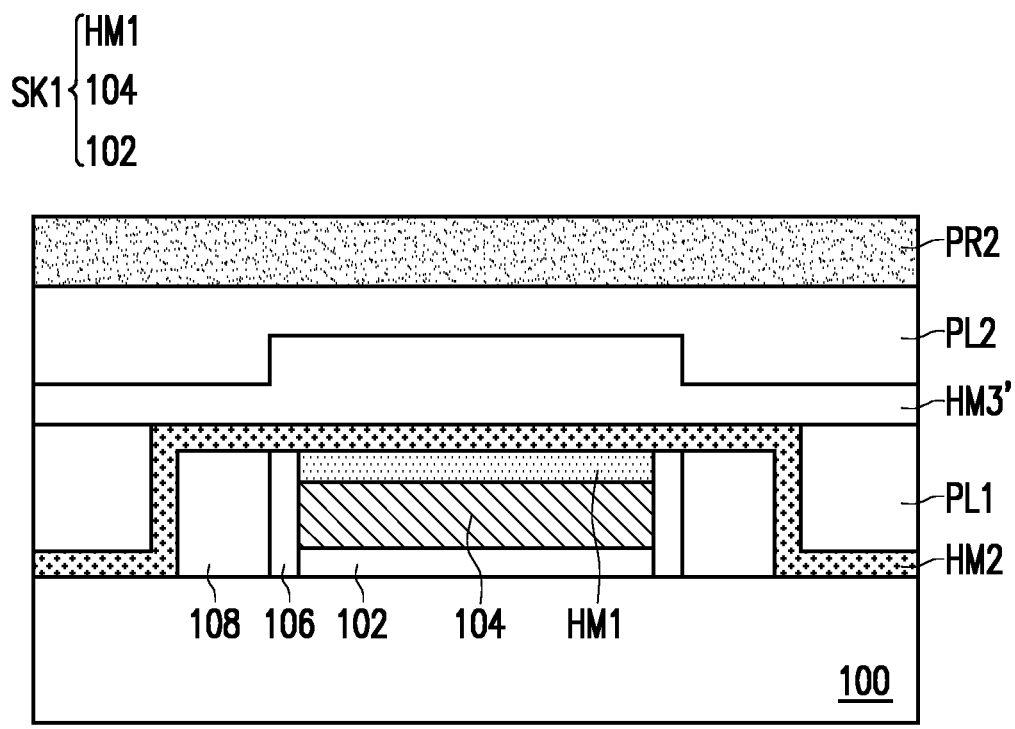
Figure 1G:
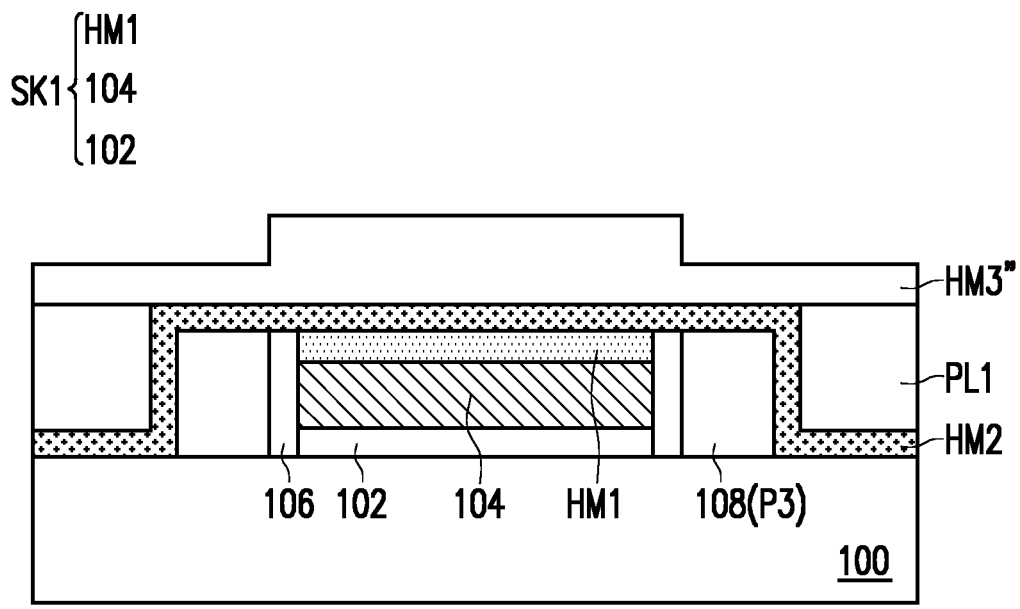
Figure 2A:
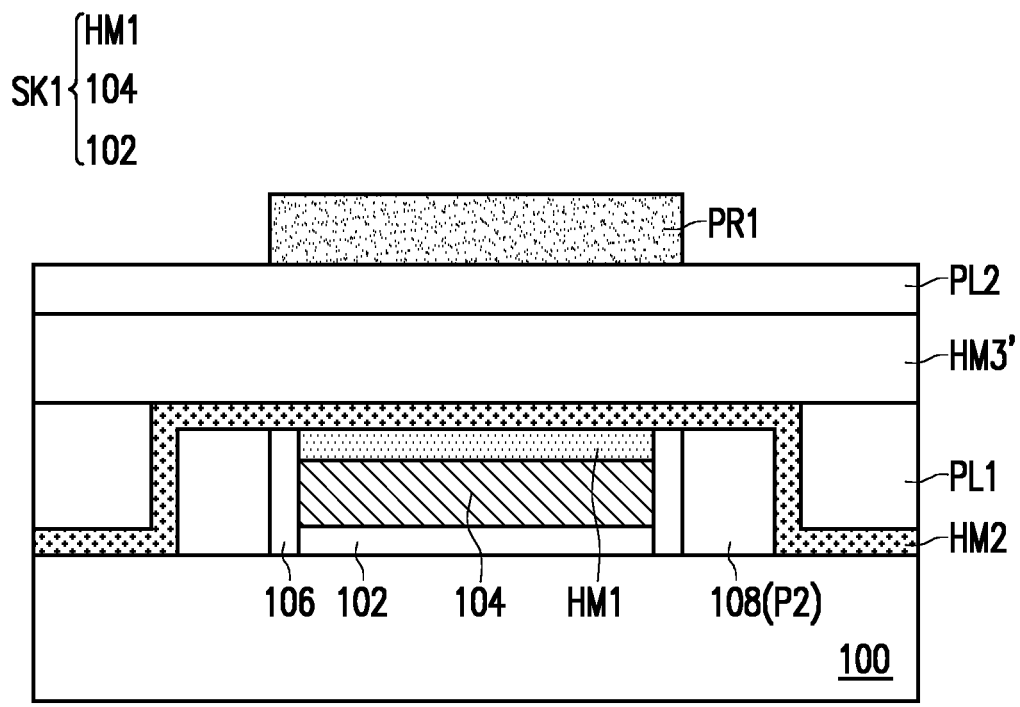
FIGS. 2A to 2G are cross-sectional views taken along the line B-B' in FIGS. 5A to 5E.
Figure 2B:
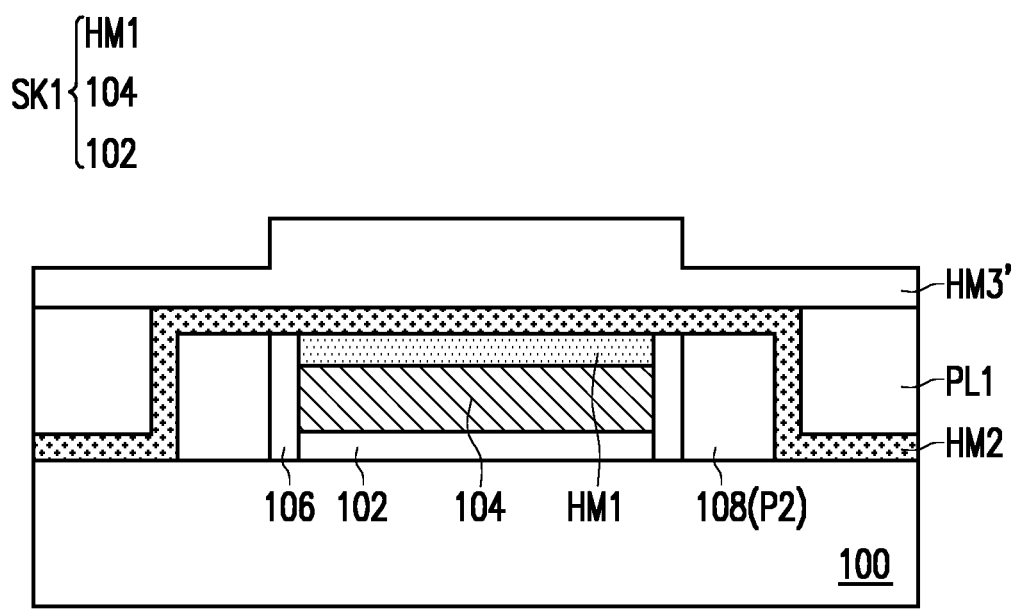

With reference to FIGS. 1F, 2A and 5A, a flat layer PL2 and a photoresist pattern PR2 are formed on the surface of the hard mask layer HM3'. The photoresist pattern PR1 includes a plurality of elongated strip-shaped patterns extending along the X direction and arranged side by side along the Y direction. Each elongated strip-shaped pattern covers multiple stacked structures SK1 below.

With reference to FIGS. 1Q 2B, 3A and 5B, using the photoresist pattern PR2 as the mask, the hard mask layer HM3' is patterned to become a hard mask layer HM3" via the anisotropic etching process, after which the photoresist pattern PR2 and the flat layer PL2 are removed. Then, using the hard mask layer HM3" as a mask, the hard mask layer HM2 undergoes an isotropic or anisotropic etching process to form a hard mask layer HM2', exposing the semiconductor layer 108 at the corner of the stacked structure SK1, also known as a part P1. Another part P2 of the semiconductor layer 108 is covered by the hard mask layer HM2' extending in the Y direction. Still another part P3 of the semiconductor layer 108 is covered by the hard mask layer HM3" extending in the X direction.

Figure 3A:
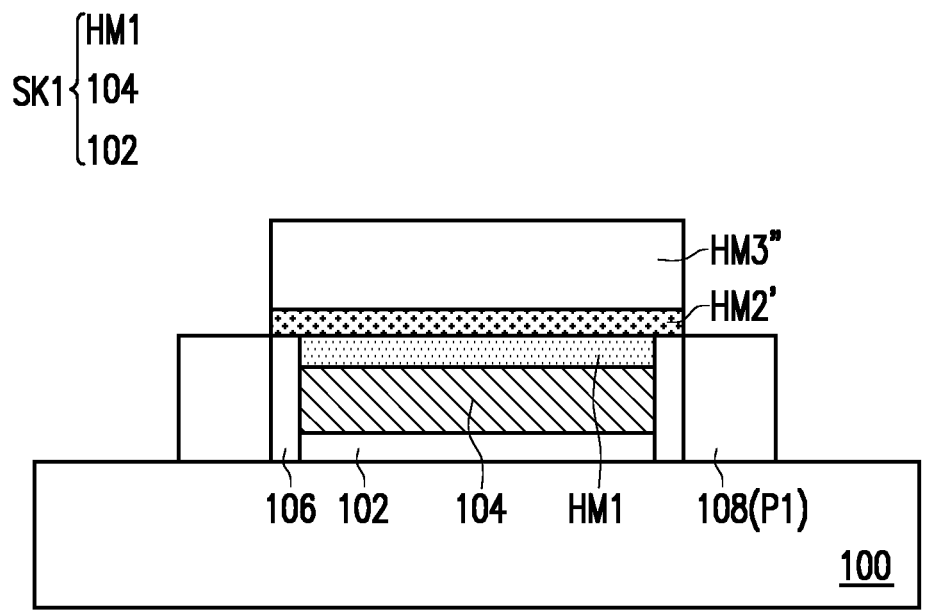
FIGS. 3A to 3N are cross-sectional views taken along the line C-C' in FIGS. 5A to 5E.
Figure 3B:
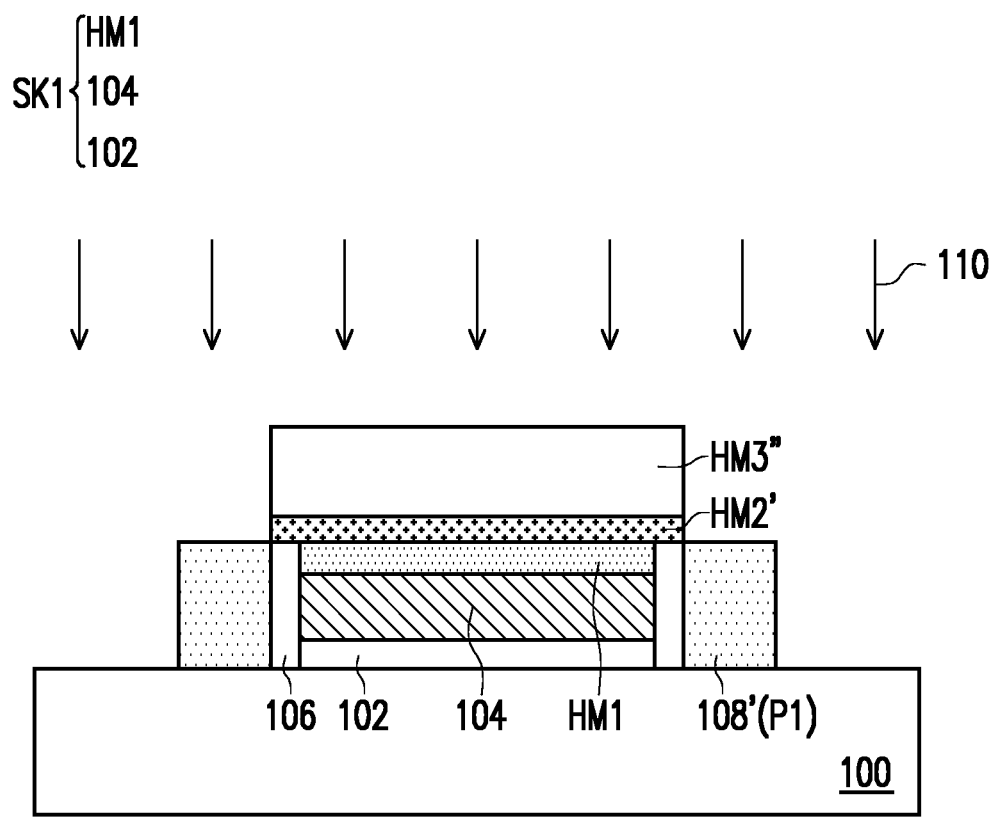
FIG. 3O is a schematic cross-sectional view of a three-dimensional semiconductor device according to an embodiment of the disclosure.

With reference to FIGS. 3B and 5B, with the hard mask layers HM3" and HM2' of the part P2 and the part P3 of the semiconductor layer 108 as the mask, an ion implantation process 110 is performed to implant the N-type dopant into the part P1 of the semiconductor layer 108 to form a semiconductor layer 108' with N-type doping.

Figure 3C:
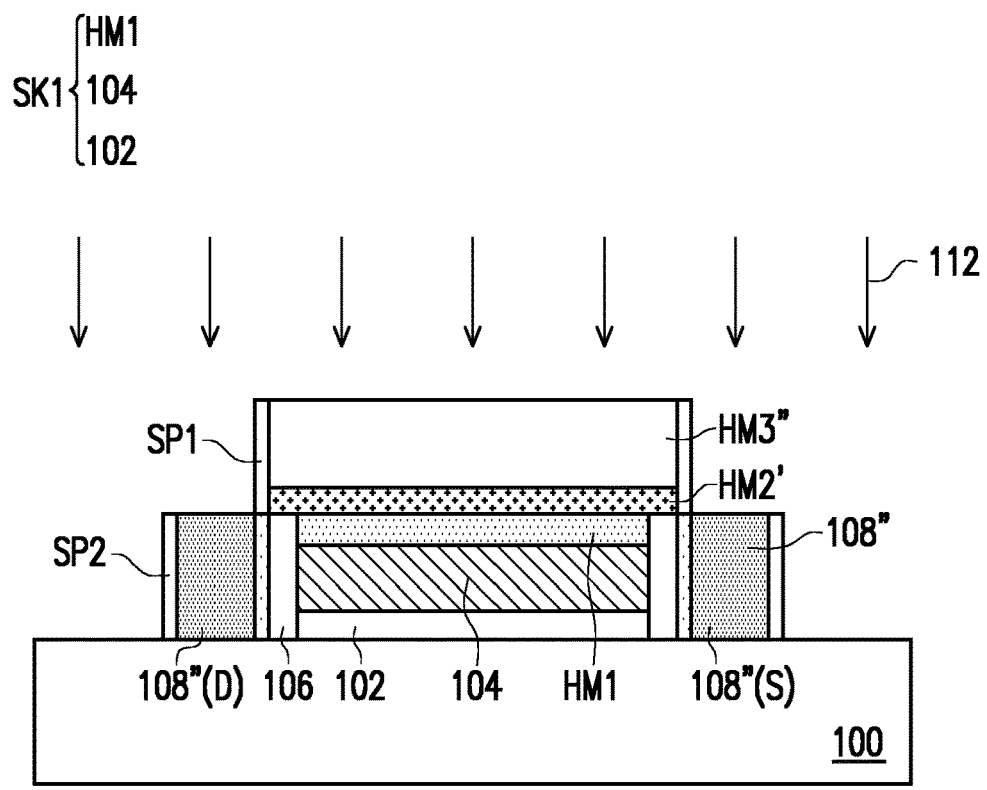

With reference to FIGS. 3B, 3C and 5B, a spacer material layer that is formed on the substrate 100 undergoes an anisotropic etching process to form a spacer SP1 on the sidewalls of the hard mask layers HM3" and HM2' and the semiconductor layer 108', and a spacer SP2 is formed on the sidewall of the semiconductor layer 108'. The spacer material layer is, for example, a silicon oxide layer. Then, using the hard mask layers HM3" and HM2' and the spacer SP1 as the mask, an ion implantation process 112 is performed to implant the N-type dopant into the semiconductor layer 108' to form a heavily doped region 108" with N-type doping.

Figure 3D:
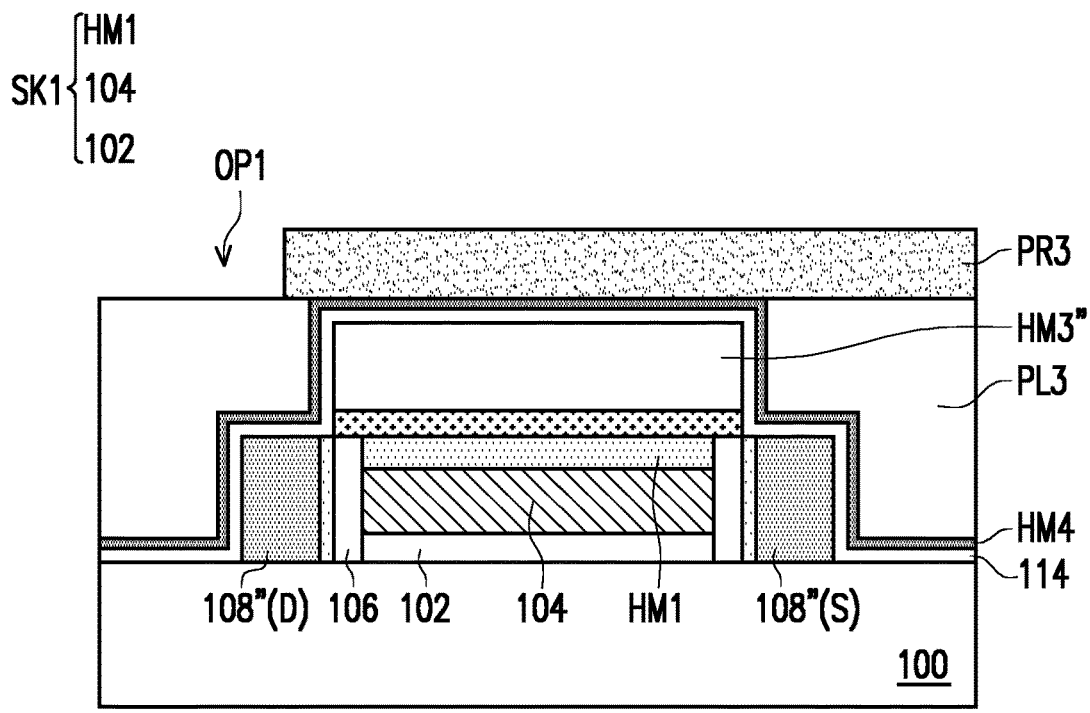
Figure 4:
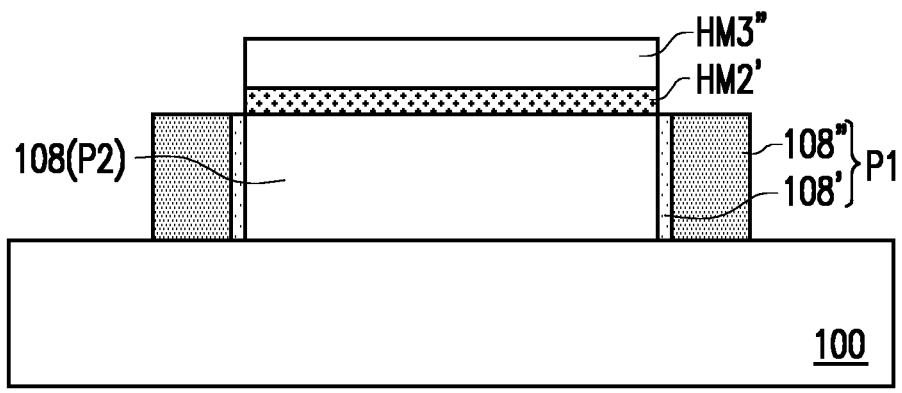
FIG. 4 is a cross-sectional view taken along the line D-D' in FIG. 5B.

With reference to FIGS. 3D, 4, and 5B, an etching process is performed to remove the spacers SP1 and SP2 and to expose the heavily doped region 108". The sidewall of the stacked structure SK1 is surrounded by the gate dielectric layer 106 and the semiconductor layer 108. The semiconductor layer 108 includes four parts P1, two parts P2, and two parts P3. The parts P1 are located at the four corners of the stacked structure SK1, which includes the semiconductor layer 108' with N-type doping and the heavily doped region 108" with N-type doping, which are located on the sidewalls of the parts P2 and P3. The part P2 has P-type dopants and is covered by the hard mask layer HM2', and the part P3 has P-type dopants and is covered by the hard mask layer HM3".

With reference to FIG. 5B, in an embodiment of the disclosure, the gate conductor layer 104 of the stacked structure SK1 serves as a common gate conductor layer of two transistors $Tr_1$ and $Tr_2$; the gate dielectric layer 106 serves as a common gate dielectric layer of the two transistors $Tr_1$ and $Tr_2$; the two parts P2 of the semiconductor layer 108 may serve as a channel layer CH1 and a channel layer CH2 of the first and second transistors, respectively. The channel layers CH1 and CH2 are also known as vertical channel layers, which form a sandwich structure with the stacked structure SK1. The heavily doped regions 108" (P3) on both sides of the channel layer CH1 and the channel layer CH2 serve as a source region S and a drain region D of the transistor $Tr_1$, and a source region S and a drain region D of the transistor $Tr_2$, respectively.

Figure 5C:
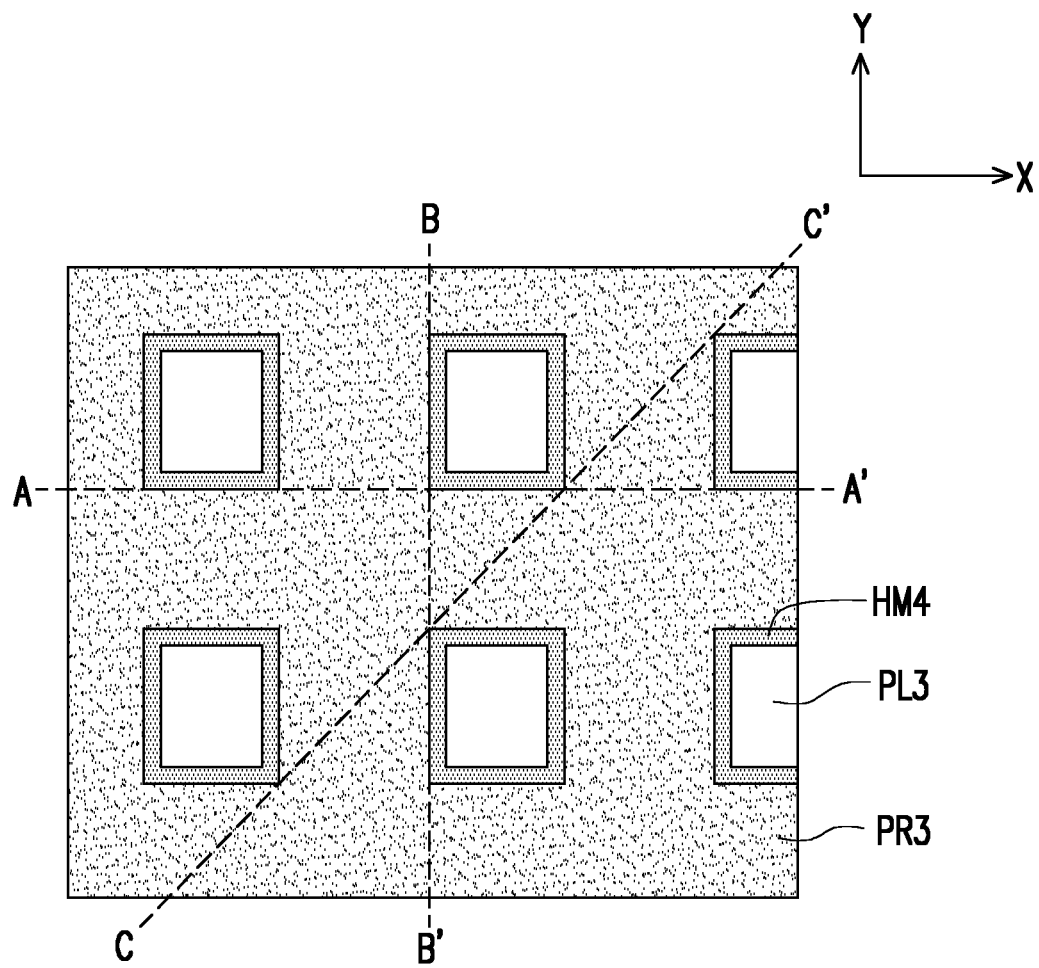

With reference to FIGS. 3D and 5C, an insulating layer 114, a hard mask layer HM4, a flat layer PL3, and a photoresist pattern PR3 are sequentially formed on the substrate 100. The insulating layer 114 is, for example, silicon oxide. The flat layer PL3 may be flattened through a chemical mechanical polishing process (CMP) so that the surface of the flat layer PL3 and the surface of the hard mask layer HM4 are substantially coplanar. The photoresist pattern PR3 has multiple strip-shaped openings OP1. The opening OP1 corresponds to a region where the RRAM is intended to be formed.

Figure 3E:
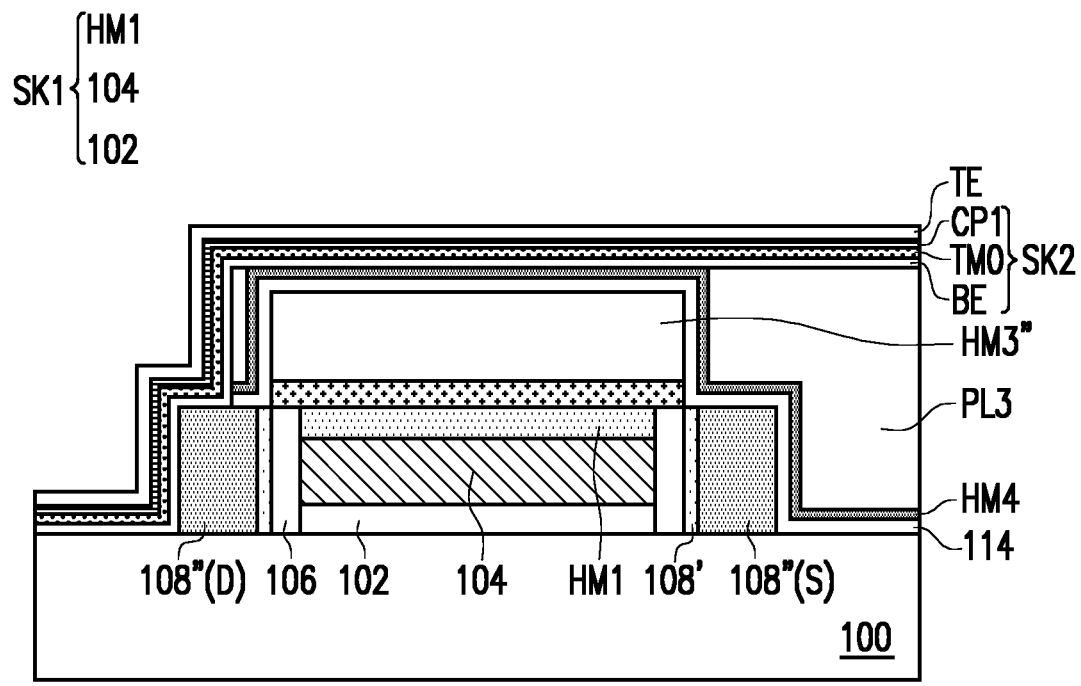

With reference to FIGS. 3E and 5C, using the photoresist pattern PR3 as a mask, an etching process is performed to remove the insulating layer 114 and the hard mask layer HM4 exposed by the opening OP1, so that part of the semiconductor layer 108" and the surface of the substrate 100 are exposed. The etching process is, for example, a wet etching process, and the etchant used is, for example, diluted hydrofluoric acid solution (DHF) and phosphoric acid. Thereafter, the photoresist pattern PR3 is removed. Then, a stacked layer SK2 used for the RRAM is formed on the substrate 100. The stacked layer SK2 from the bottom to the top includes a first electrode layer BE, a variable resistance layer TMO, a capping layer CP1, and a second electrode layer TE. The materials of the first electrode layer BE and the second electrode layer TE include Ti, TiN, Ta, TaN, Pt, Au, Ir, Ru, W, Al, Zr, Hf, Ni, Cu, Co, Fe, or a combination thereof, and the formation method is, for example, physical vapor deposition or chemical vapor deposition. The materials of the variable resistance layer TMO may include metal oxides, such as hafnium oxide (for example, HfO or $HfO_2$), lanthanum oxide, hafnium oxide, yttrium oxide, zirconium oxide, titanium oxide, tantalum oxide, nickel oxide, tungsten oxide, copper oxide, cobalt oxide, iron oxide, aluminum oxide, or a combination thereof, and the formation method is, for example, chemical vapor deposition. The materials of the capping layer CP1 and a capping layer CP2 mentioned subsequently are, for example, aluminum oxide, hafnium, tantalum oxide or a combination thereof, formed by chemical vapor deposition. The capping layers CP1 and CP2 may be identical to or different from each other.

Figure 3F:
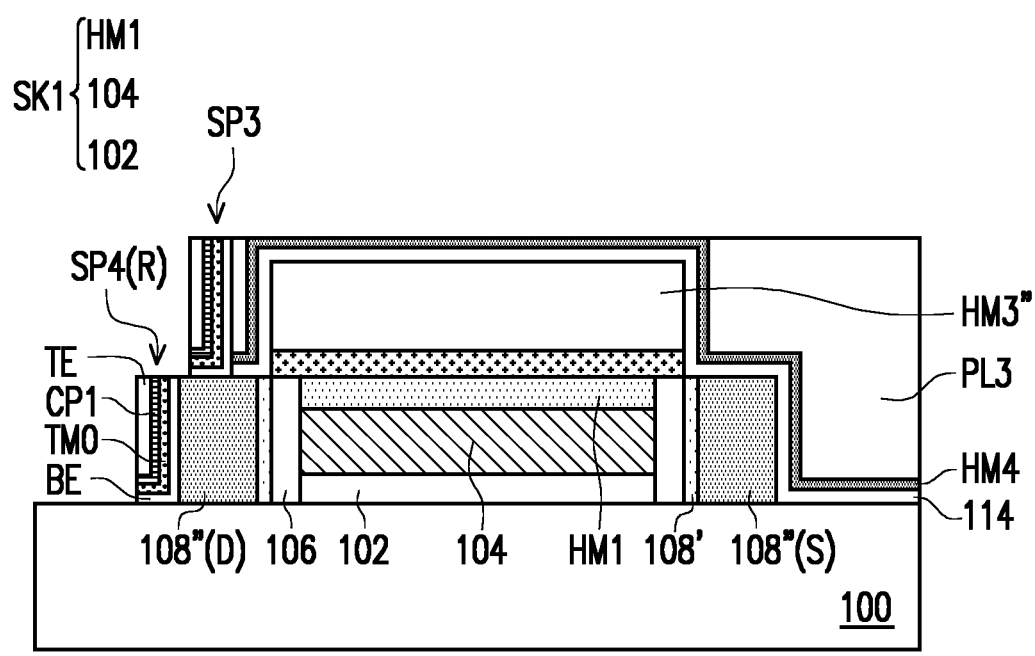
Figure 5D:
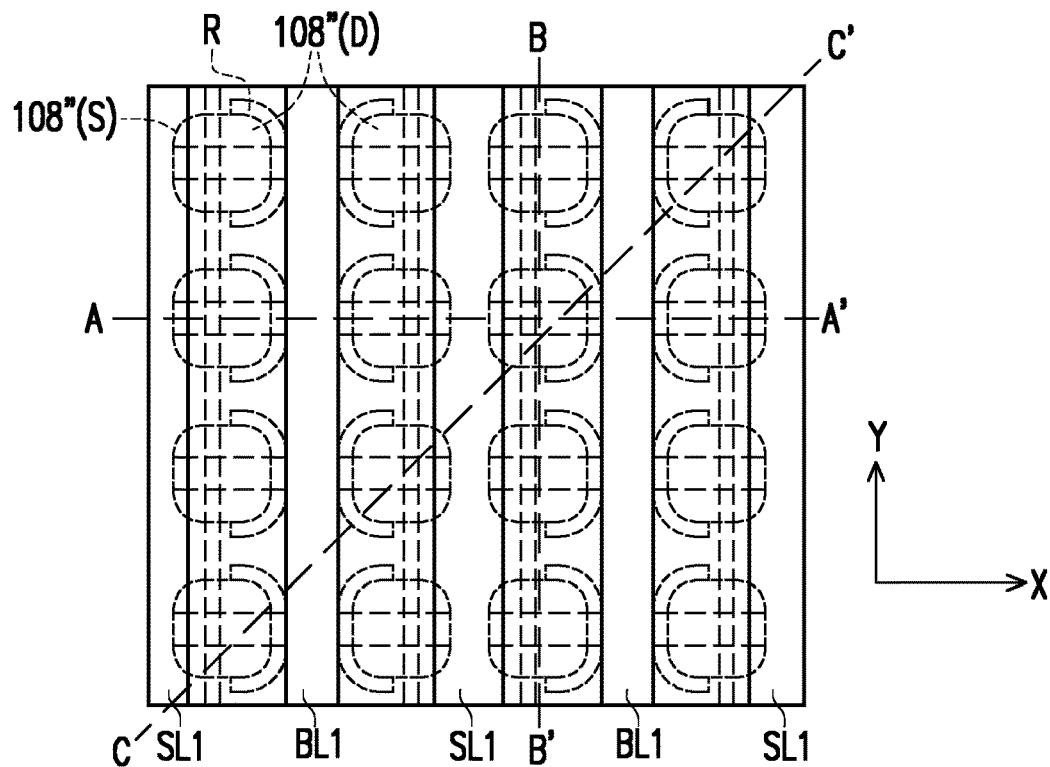

With reference to FIGS. 3F and 5D, an anisotropic etching process is performed on the stacked layer SK2 to form spacers SP3 and SP4. The spacer SP4 may be used as a memory cell R of the RRAM. In this embodiment, each stacked structure SK1 and the surrounding semiconductor layer 108 configure the two transistors $Tr_1$ and $Tr_2$, as illustrated in FIG. 5B, wherein each stacked structure SK1 has two memory cells R electrically connected to it in its surroundings (spacer SP4). The height of the memory cell R is approximately equal to the height of the stacked structure SK1, and they are located on the sidewalls of the drain region D (heavily doped region 108") of the two transistors respectively. The first electrode layer BE of each memory cell R is electrically connected to the corresponding drain region D of the transistor. The semiconductor layer 108" as the source region S has no spacer SP4 formed on its sidewall. The memory cells R beside multiple stacked structures SK1 that are in the same column are also arranged in a column. The two memory cells R beside each stacked structure SK1 are adjacent to the two memory cells R beside the adjacent stacked structure SK1.

Figure 3G:
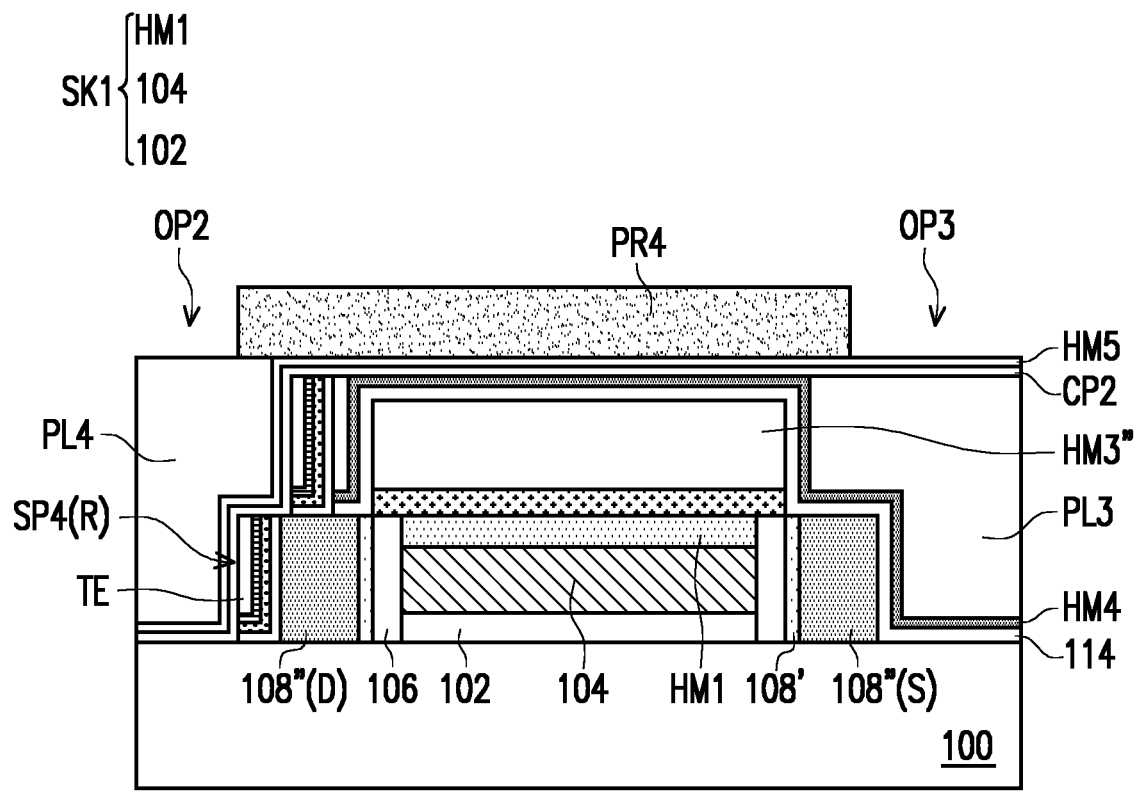

With reference to FIG. 3G a capping layer CP2, a hard mask layer HM5, a flat layer PL4 and a photoresist pattern PR4 are formed on the substrate 100. The flat layer PL4 may be flattened by CMP so that the surface of the flat layer PL4 and the surface of the hard mask layer HM5 are substantially coplanar. The photoresist pattern PR4 has a plurality of openings OP2 and OP3 extending along the Y direction and arranged along the X direction. The opening OP2 corresponds to the region where a bit line is intended to be formed; the opening OP3 corresponds to the region where a source line is intended to be formed.

Figure 3H:
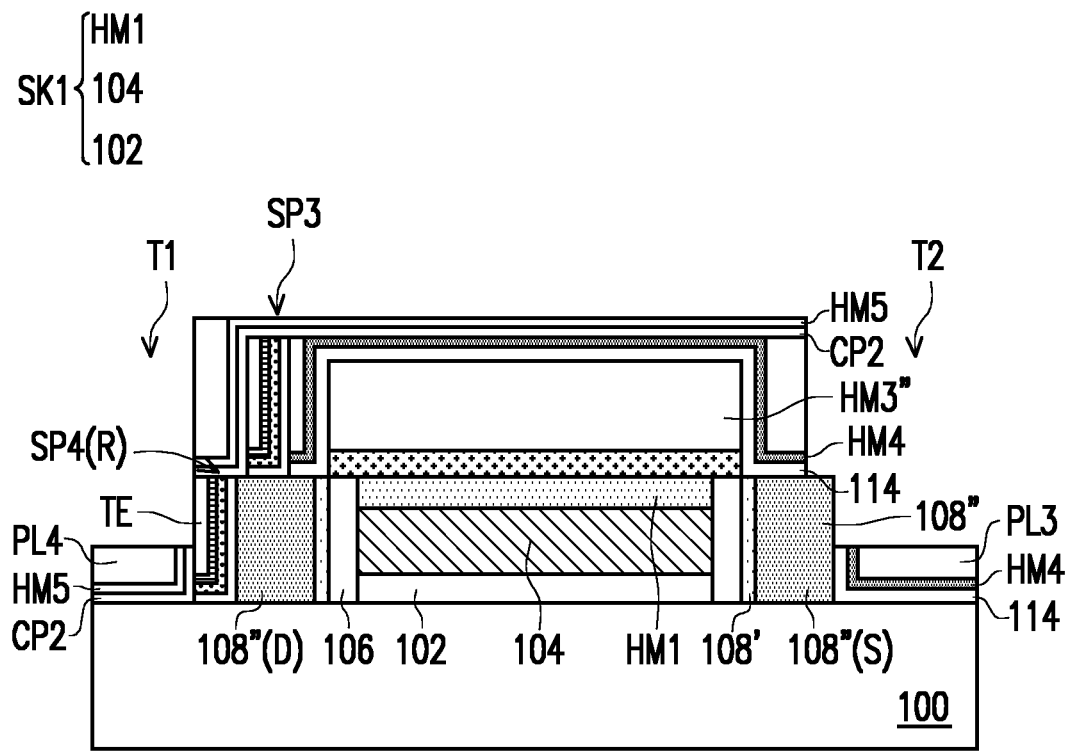

With reference to FIG. 3H, using the photoresist pattern PR4 as a mask, trenches T1 and T2 are formed via an etching process. The sidewall of the trench T1 exposes the second electrode layer TE of the memory cell R; the sidewall of the trench T2 exposes the heavily doped region 108", which serves as the source region S. The etching process is, for example, dry etching and wet etching processes. Thereafter, the photoresist pattern PR4 is removed.

Figure 3I:
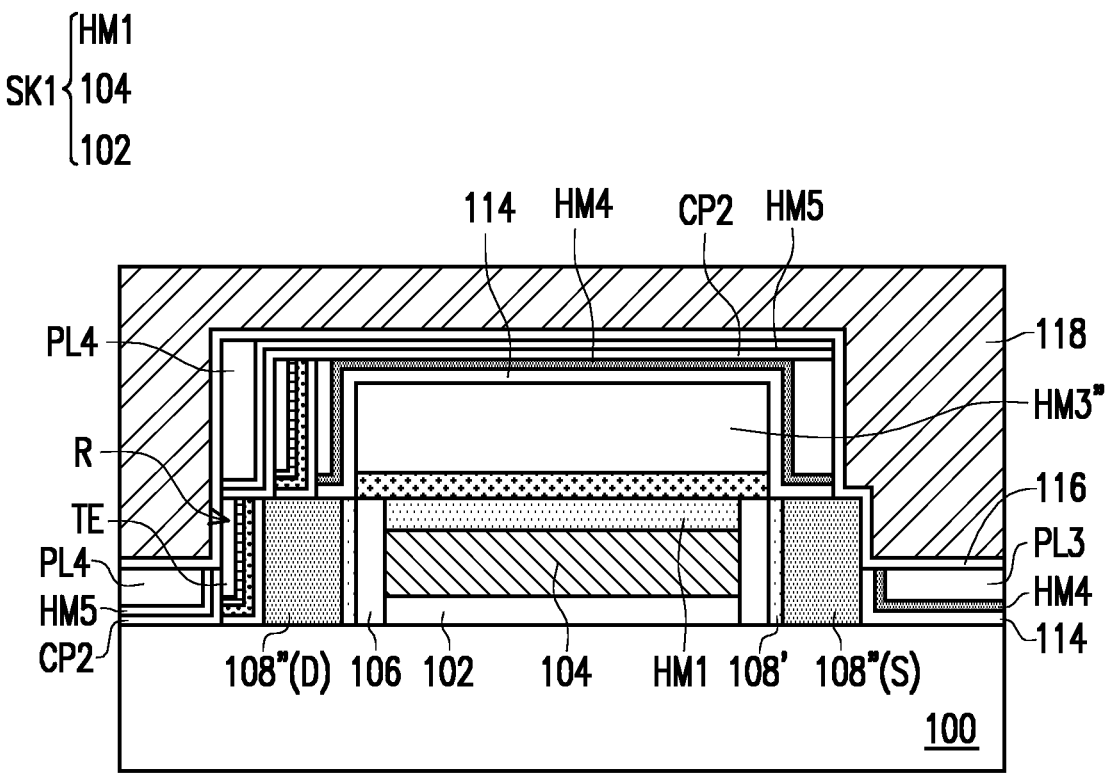

With reference to FIG. 3I, a barrier layer 116 and a conductor layer 118 are formed on the substrate 100 and in the trenches T1 and T2. The barrier layer 116 is, for example, titanium, titanium nitride, or a combination thereof. The conductor layer 118 may be a metal layer, such as tungsten.

Figure 3J:
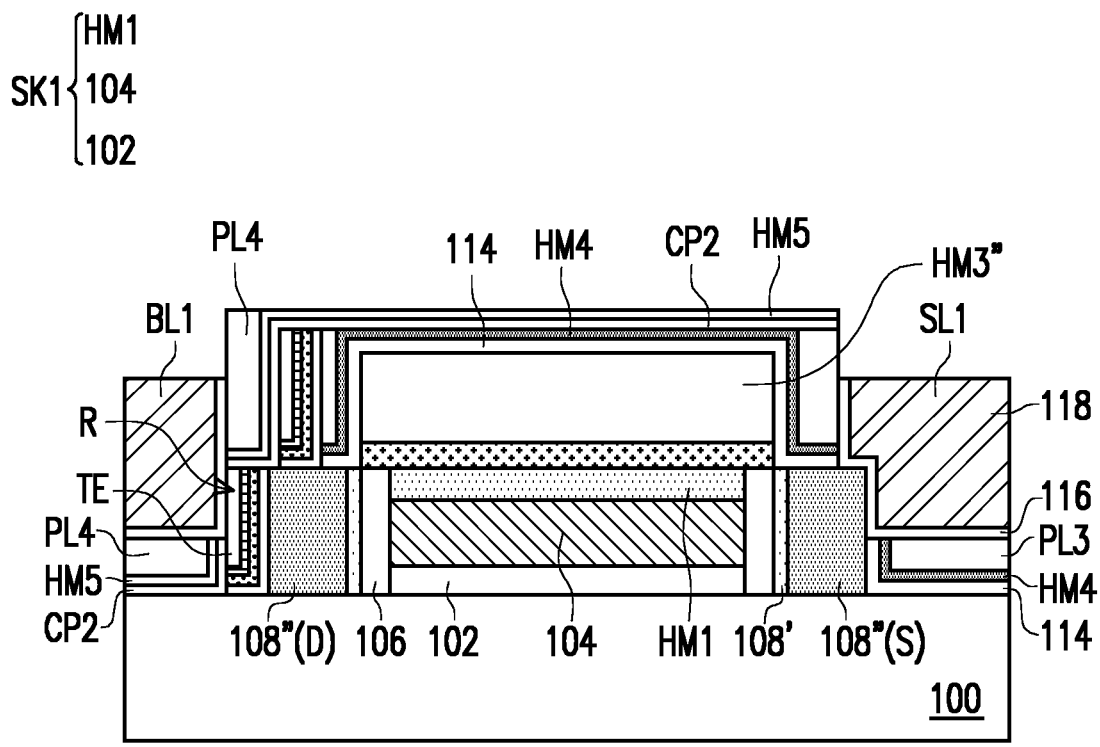

With reference to FIGS. 3J and 5D, the barrier layer 116 and the conductor layer 118 on the hard mask layer HM5 are removed via an etch-back process, and then a bit line BL1 and a source line SL1 are formed in the trenches T1 and T2, respectively. As shown in FIG. 5D, both the bit line BL1 and the source line SL1 extend along the Y direction and are disposed alternately with each other. The bit line BL1 is electrically connected to the second electrode layer TE of a plurality of memory cells R in the two adjacent columns along the Y direction. The source line SL1 is electrically connected to a plurality of heavily doped regions 108" which serve as the source regions S in the two adjacent columns along the Y direction.

Figure 3K:
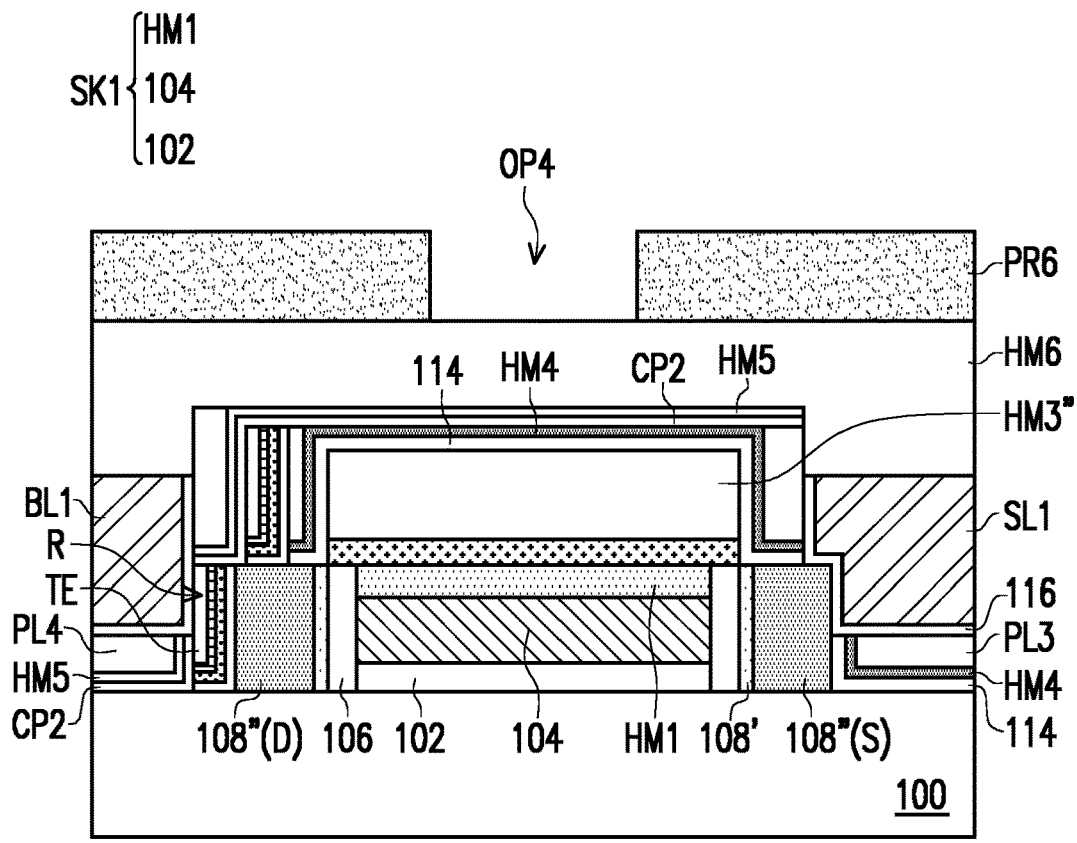

With reference to FIG. 3K, a hard mask layer HM6 and a photoresist pattern PR5 are formed on the substrate 100. The photoresist pattern PR5 has a plurality of openings OP4 corresponding to the position of the stacked structure SK1.

Figure 3L:
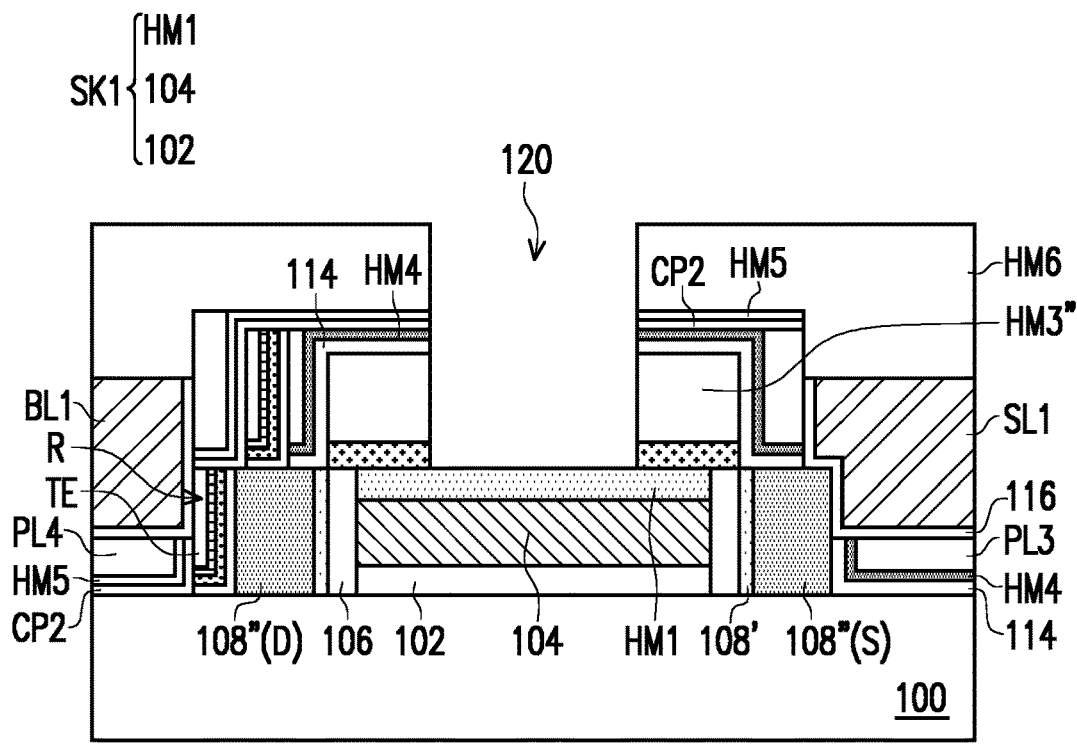

With reference to FIG. 3L, a plurality of contact holes 120 are formed via an anisotropic etching process. Each contact hole 120 exposes the hard mask layer HM1 of the stacked structure SK1.

Figure 1H:
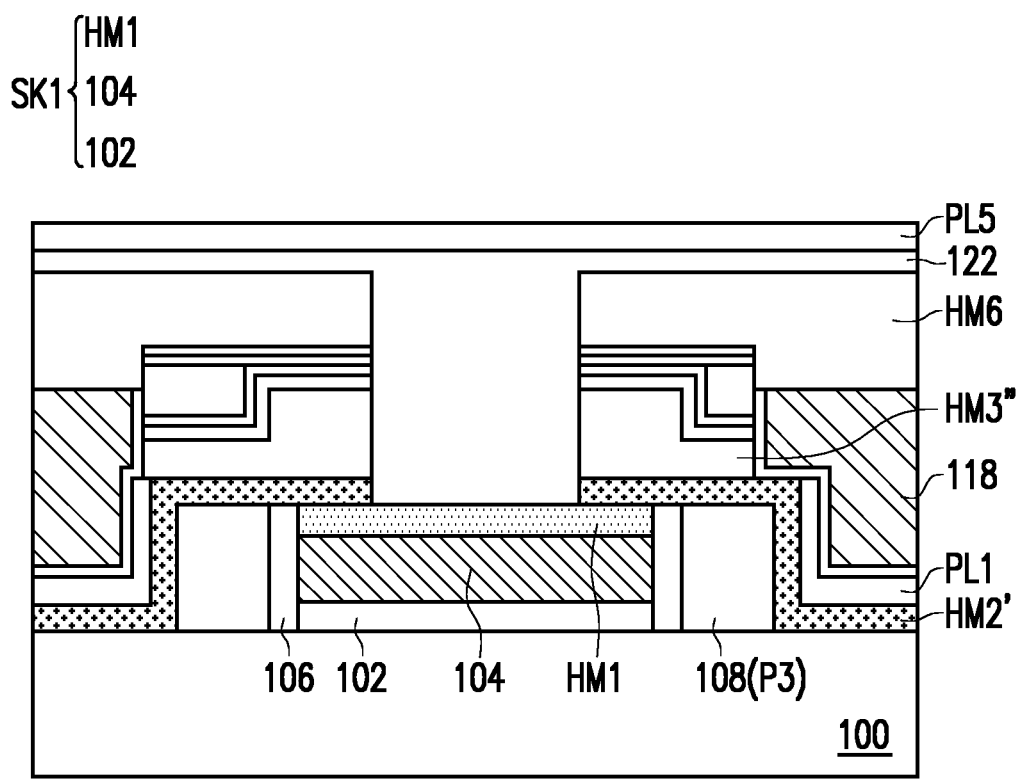
Figure 3M:
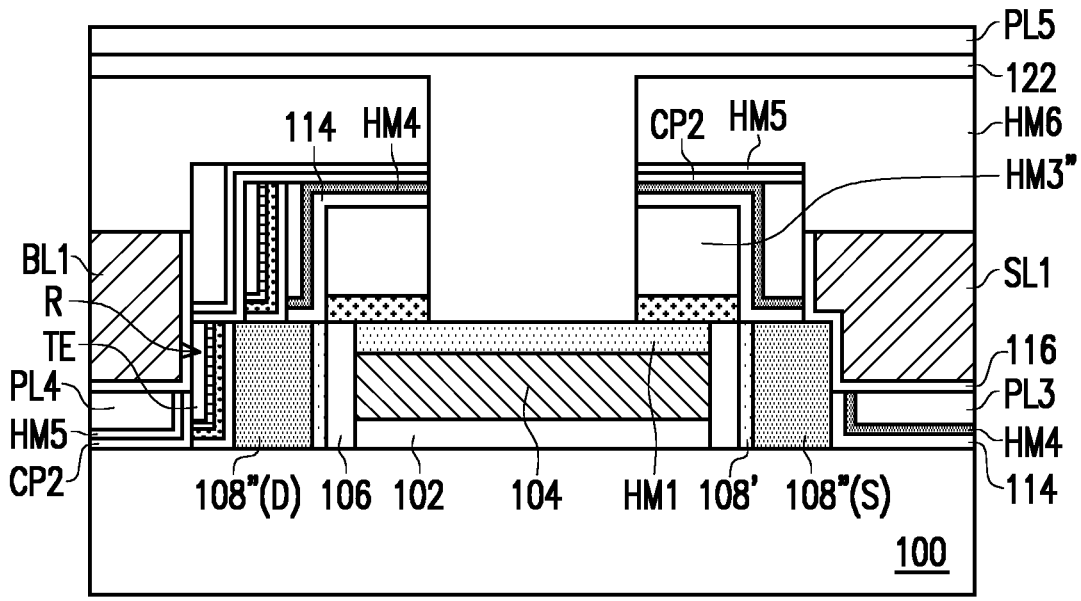

With reference to FIGS. 3M and 1H, a filling layer 122 is formed in the contact hole 120, and a flat layer PL5 is formed on the filling layer 122. The filling layer 122 is, for example, SOC; the flat layer PL5 is, for example, spin on silicon anti-reflection coating (SOSA) or silicon-containing hard-mask bottom anti-reflection coating (SHB).

Figure 1I:
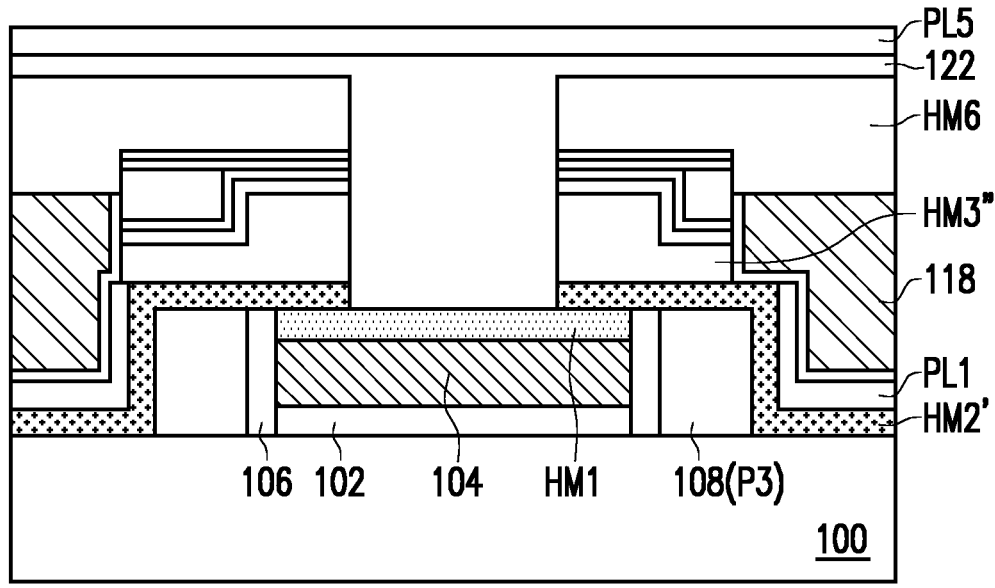
Figure 2C:
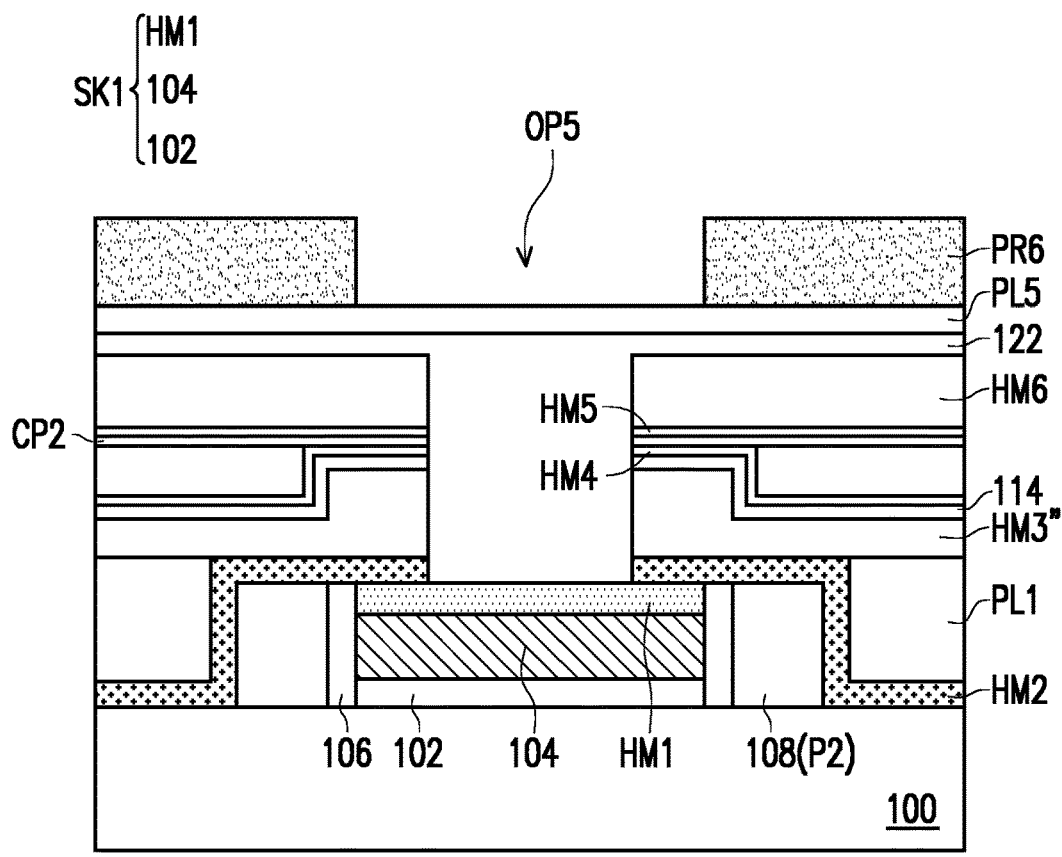

With reference to FIGS. 2C and 1I, a photoresist pattern PR6 is formed on the substrate 100. The photoresist pattern PR6 has a plurality of openings OP5 extending in the X direction and arranged along the Y direction. The opening OP5 corresponds to the region where a word line is intended to be formed.

Figure 1J:
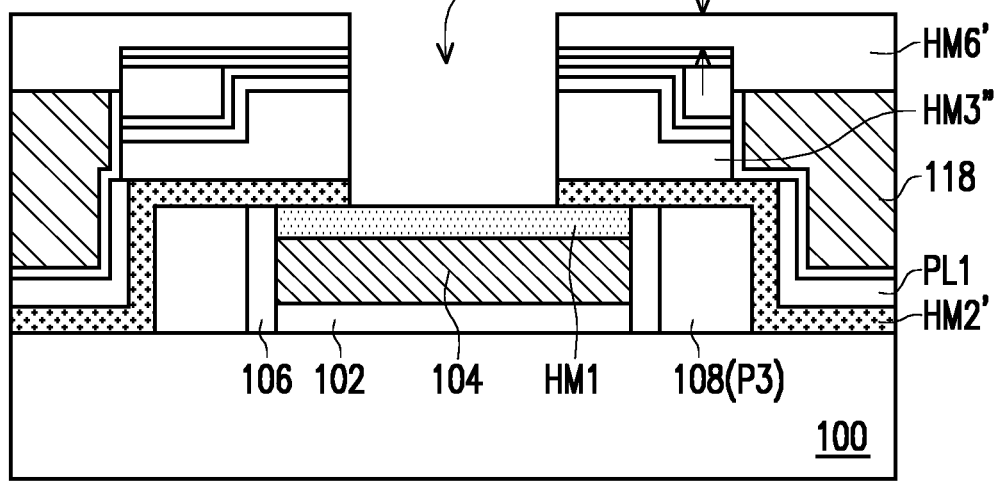
Figure 2D:
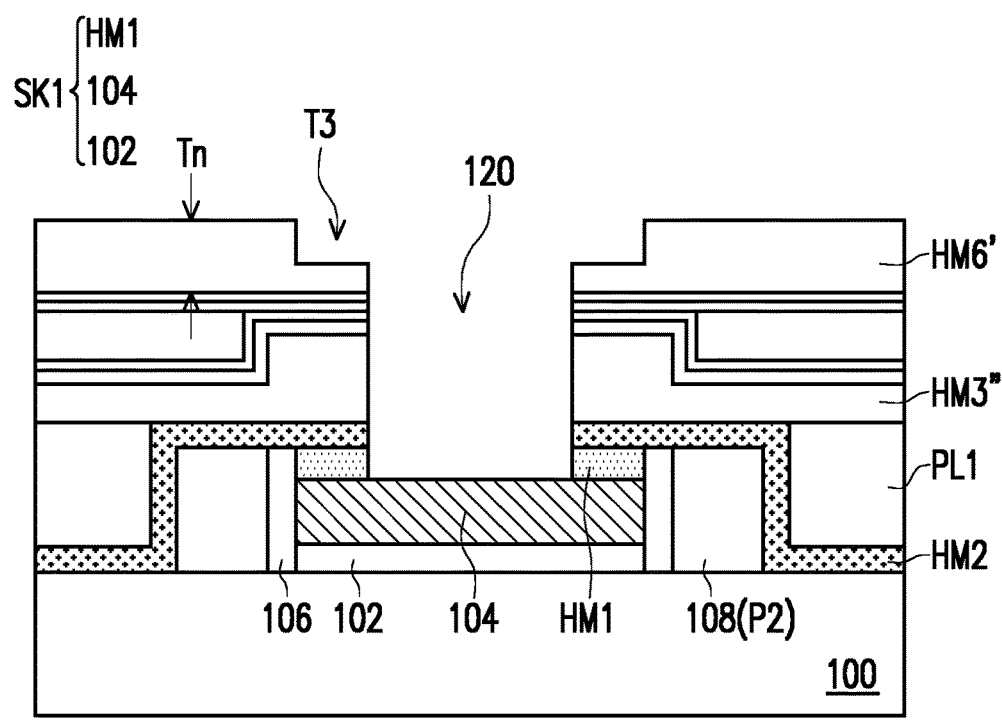

With reference to FIGS. 1J and 2D, using the photoresist pattern PR6 as a mask, the hard mask layer HM1 exposed by the contact hole 120 is removed via an anisotropic etching process to expose the gate conductor layer 104, and part of the hard mask layer HM6 is also removed to form multiple trenches T3. Each trench T3 extends along the X direction and spatially communicates with the contact holes 120 on the plurality of stacked structures SK1 in the X direction. The hard mask layer HM6' is formed from the etched hard mask layer HM6. The thickness Tw of the hard mask layer HM6' in the word line region is thinner than the thickness Tn of the hard mask layer HM6' in regions outside of the word line region.

Figure 1K:
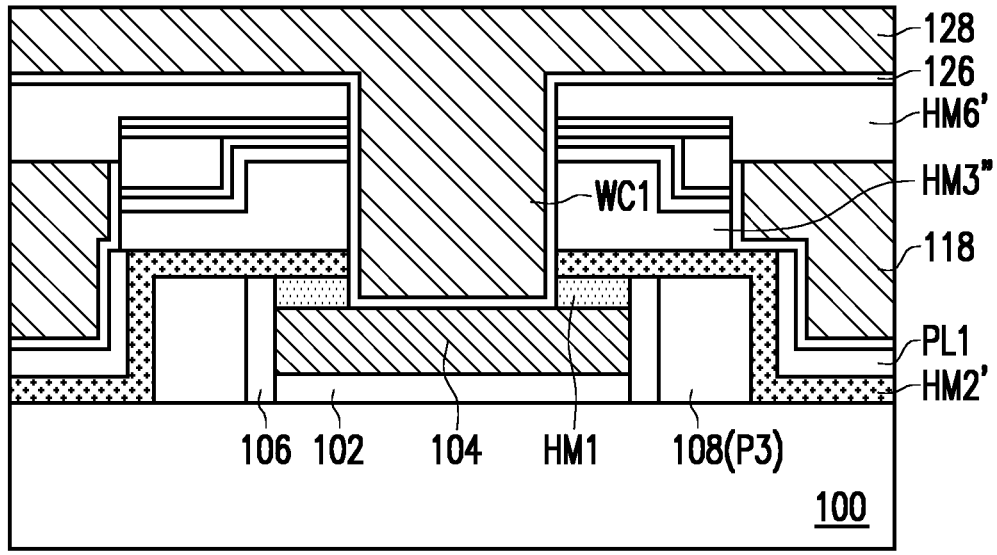
Figure 2E:
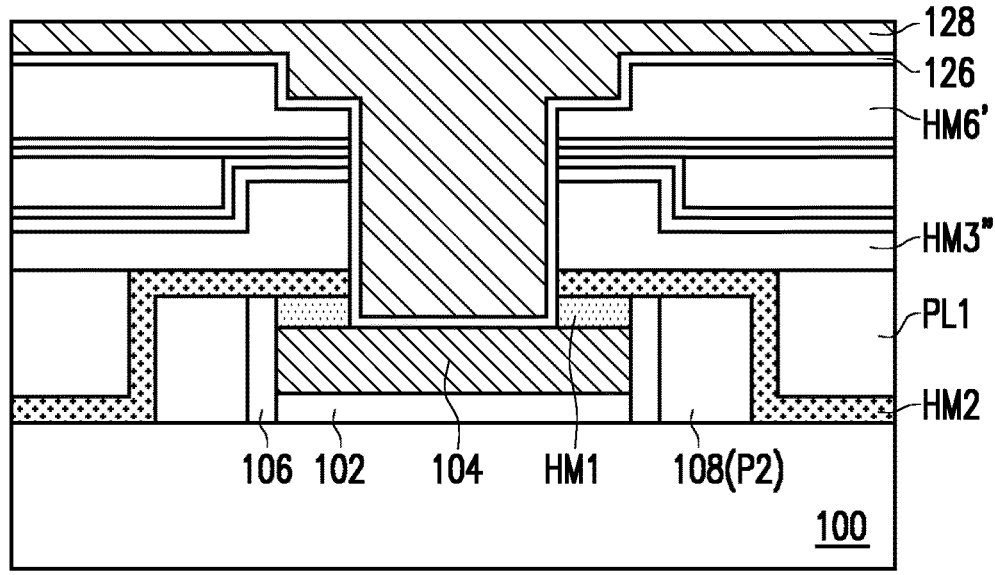

With reference to FIGS. 1K and 2E, a barrier layer 126 and a conductor layer 128 are formed on the substrate 100 and in the trench T3 and the contact hole 120. The barrier layer 126 is, for example, titanium, titanium nitride, or a combination thereof. The conductor layer 128 may be a metal layer, such as tungsten.

Figure 1L:
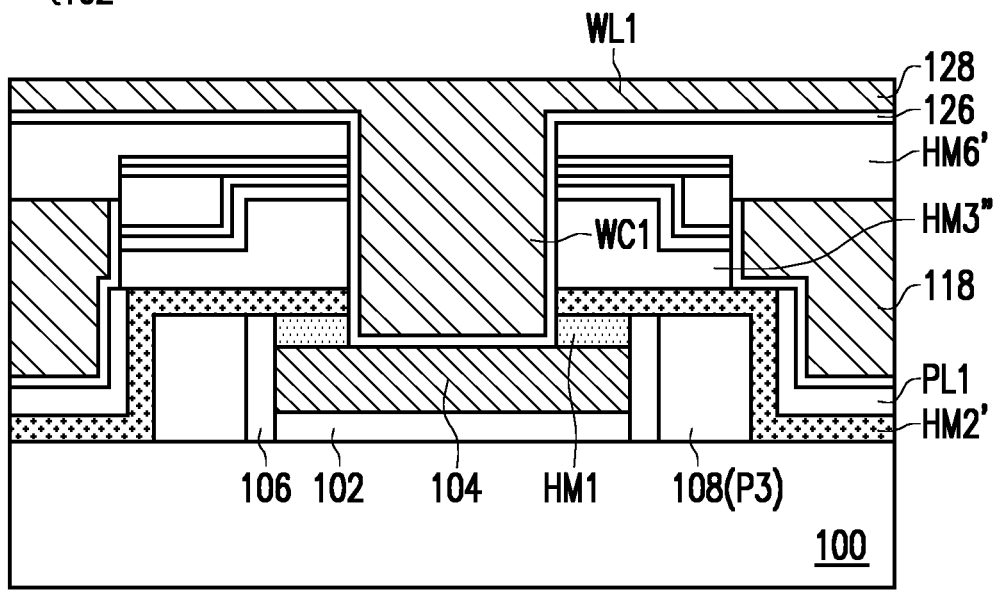
Figure 2F:
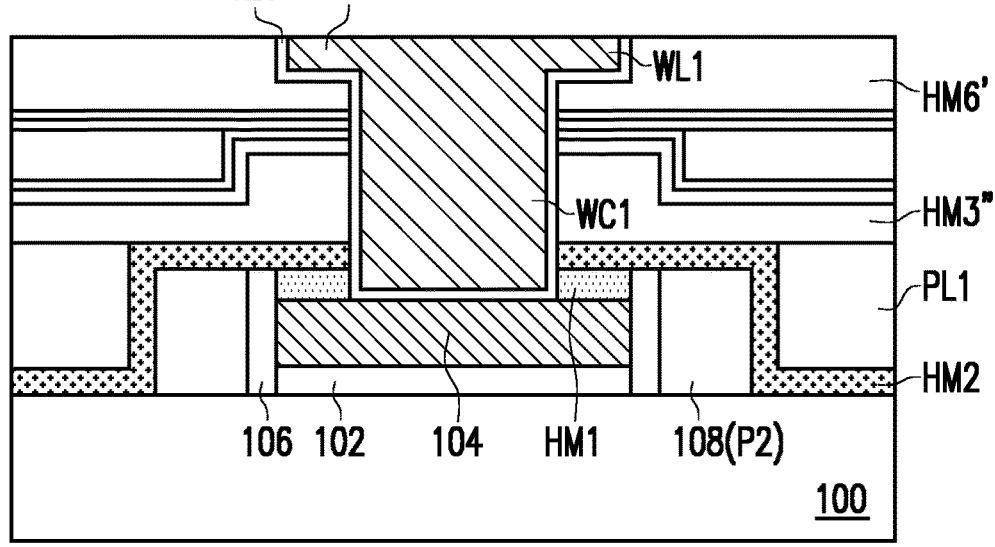
Figure 2G:
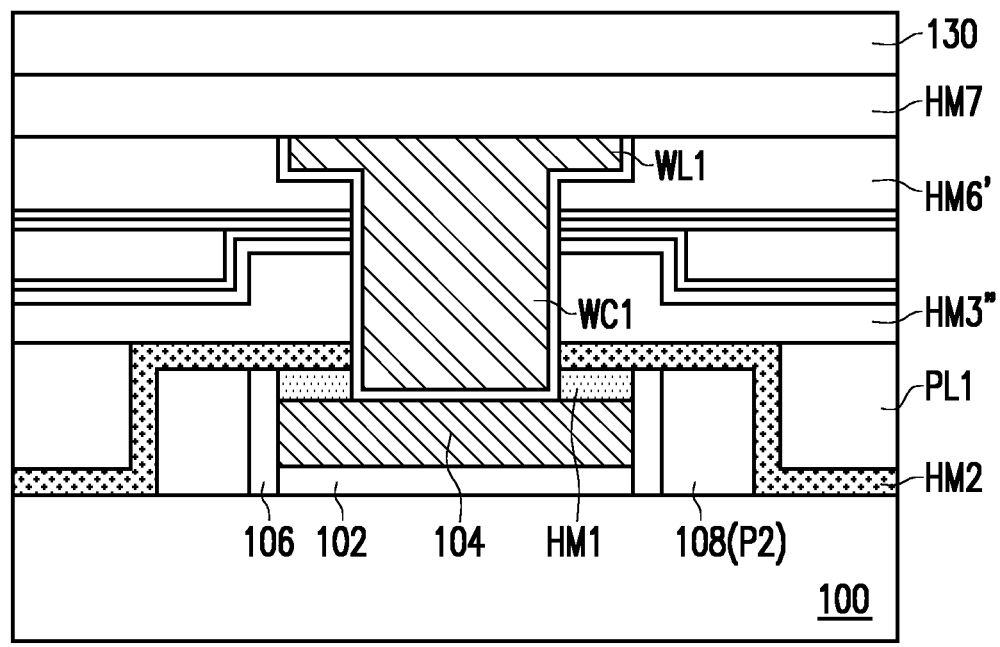
Figure 5E:
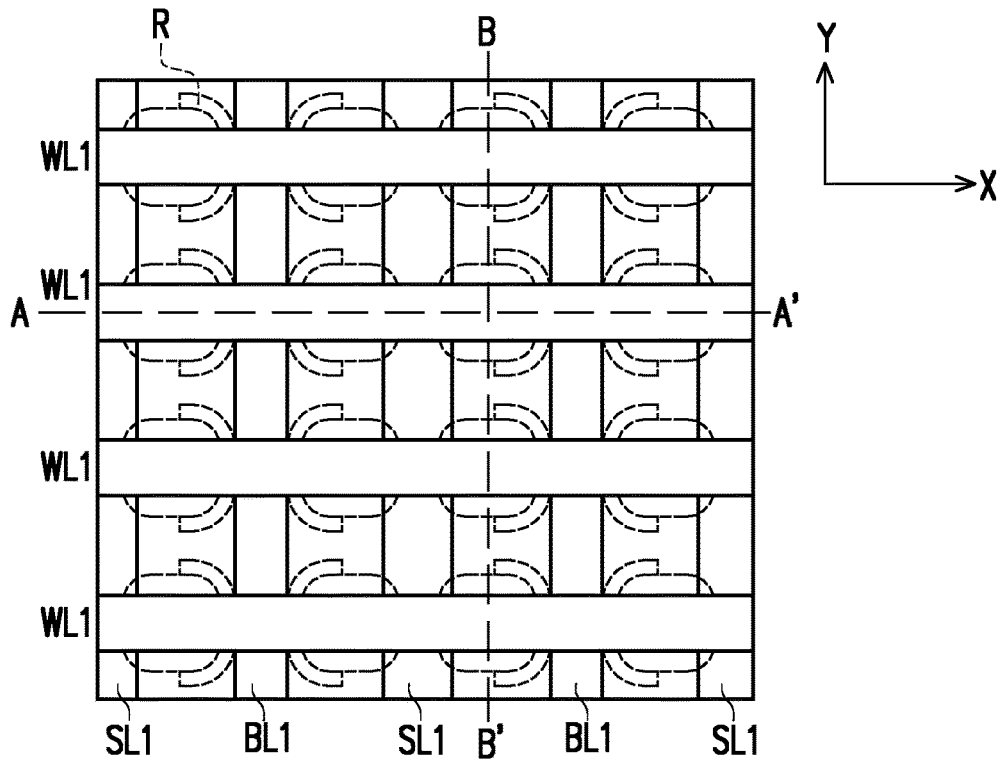

With reference to FIGS. 1L, 2F and 5E, using the hard mask layer HM6' in the regions outside of the word line region as a stop layer, the hard mask layer HM6' in the region outside of the word line region is removed via the CMP process. The barrier layer 126 and the conductor layer 128 left in the contact hole 120 may be used as a word line contact window WC1; the barrier layer 126 and the conductor layer 128 left in the word line region may be used as a word line WL1. The word line WL1 extends along the X direction and is arranged along the Y direction. Each word line WL1 is electrically connected to the gate conductor layer 104 in the same row below via the word line contact window WC1.

Figure 1M:
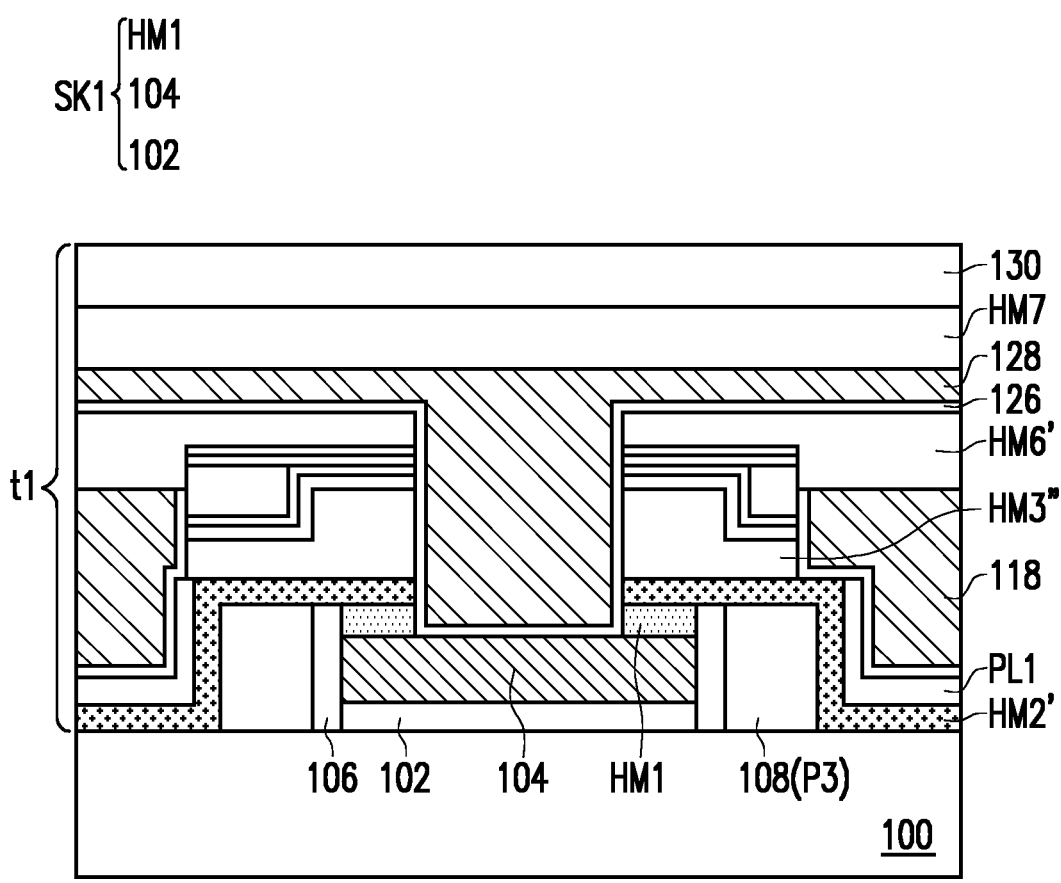
Figure 3N:
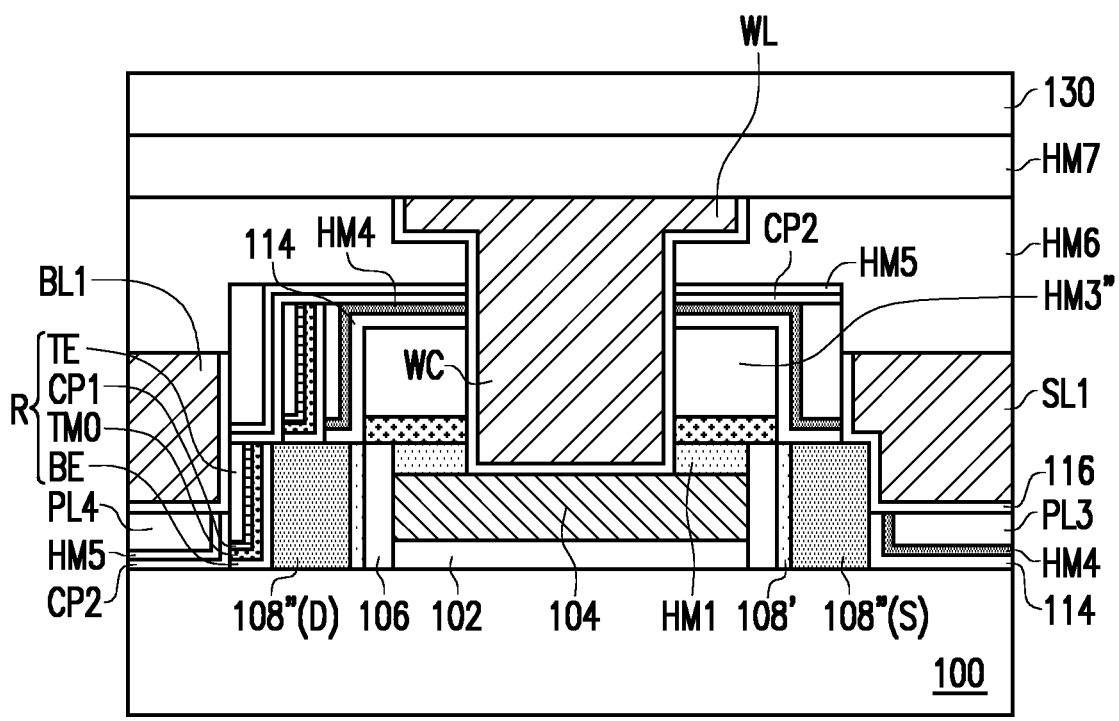
Figure 30:
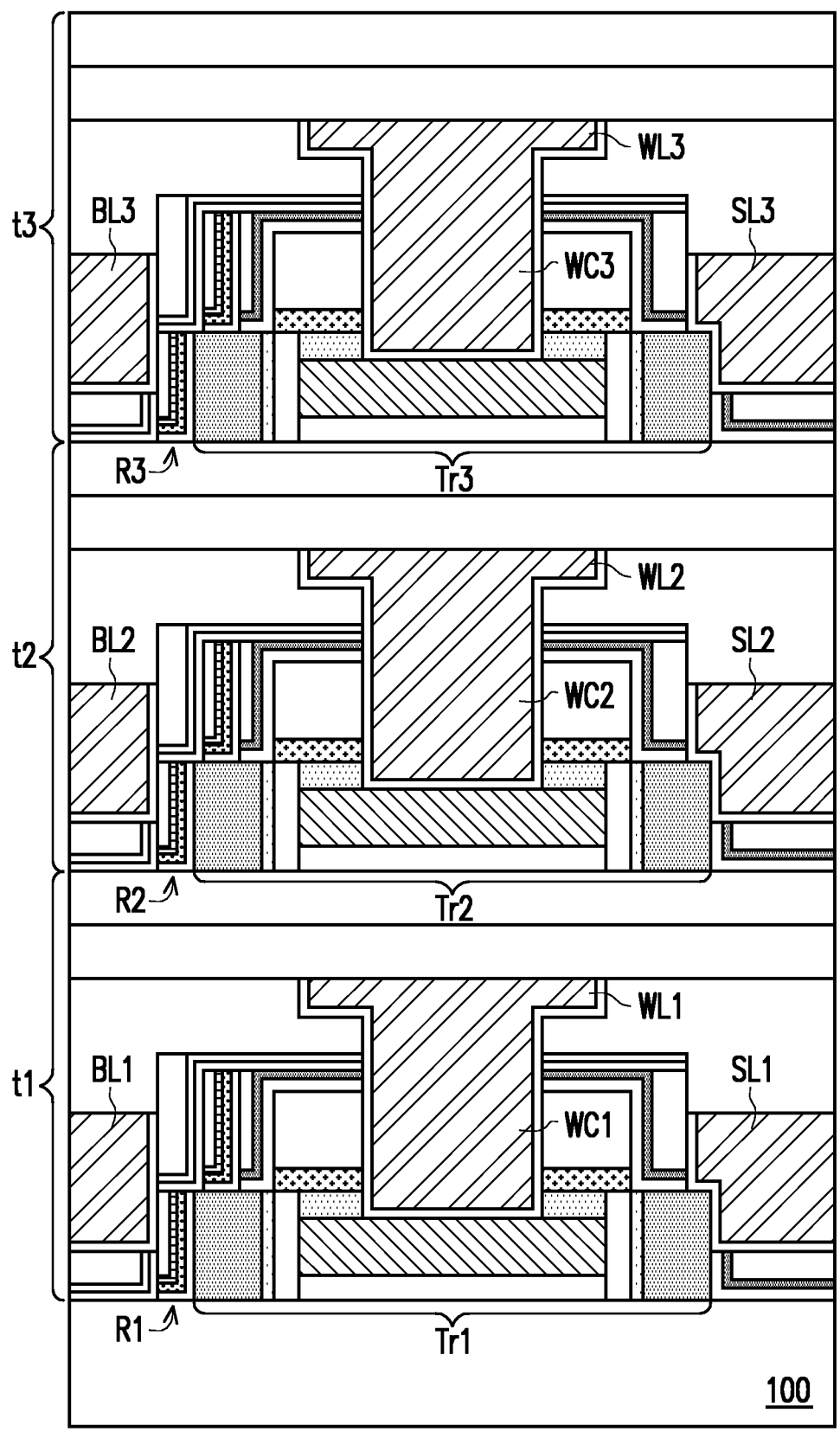

With reference to FIGS. 1M, 2Q and 3N, a hard mask layer HM7 and an insulating layer 130 are formed on the substrate 100. The insulating layer 130 is, for example, silicon oxide. Till this point, the fabrication of a first semiconductor device layer t1 of the three-dimensional semiconductor device is completed.

Figure 6A:
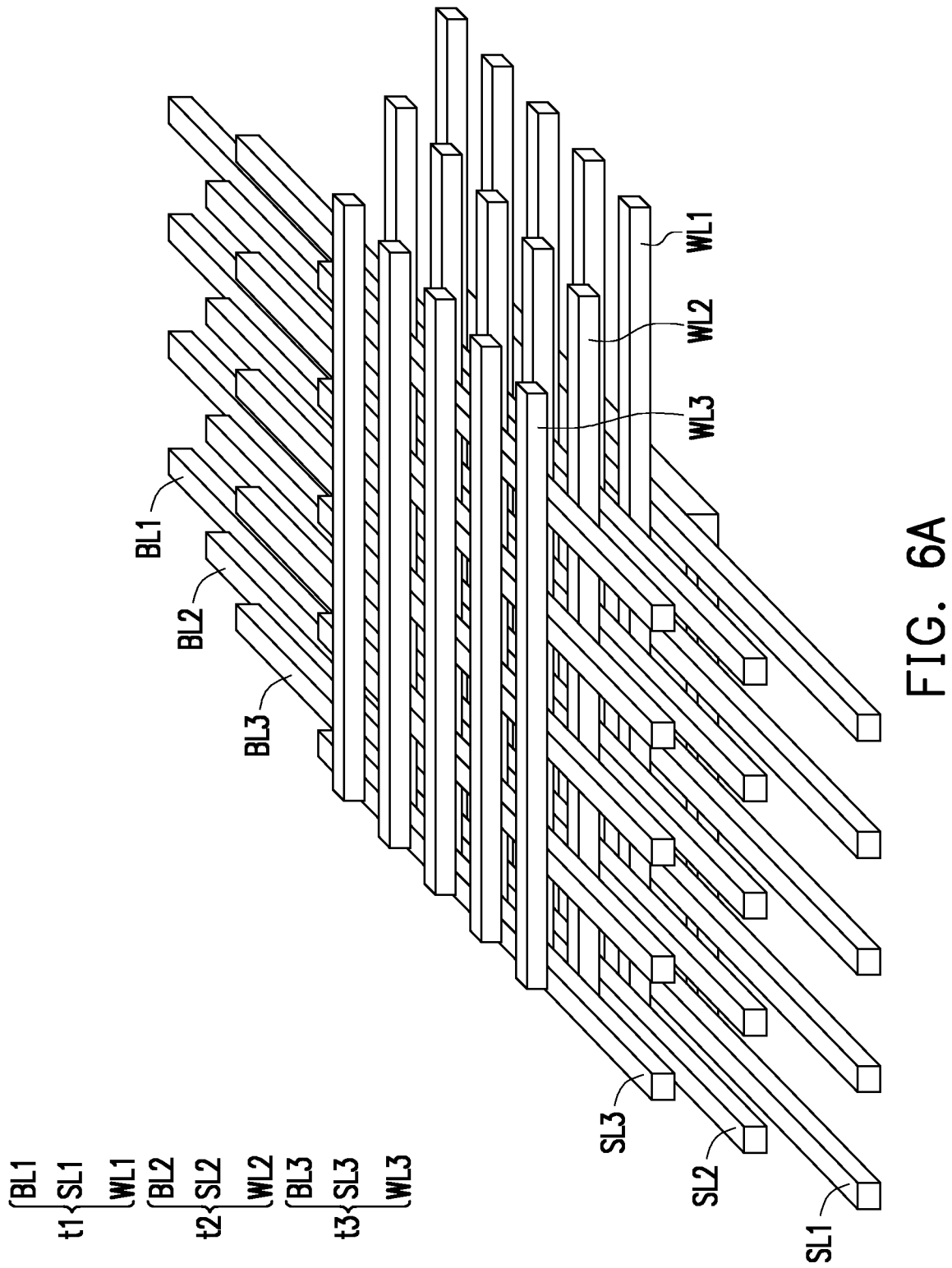
FIGS. 6A and 6B are schematic perspective views of a fabricating process of another part of the first semiconductor device layer of a three-dimensional semiconductor device according to an embodiment of the disclosure.

With reference to FIGS. 3O and 6A, a second semiconductor device layer t2 and a third semiconductor device layer t3 of the three-dimensional semiconductor device that are sequentially stacked are fabricated according to the abovementioned method of fabricating the first semiconductor device layer t1 of the three-dimensional semiconductor device. The number of stacked semiconductor device layers of a three-dimensional semiconductor device is not limited to three layers. The first semiconductor device layer t1 of the three-dimensional semiconductor device includes multiple transistors T1, multiple memory cells R1, multiple bit lines BL1, multiple source lines SL1, and multiple word lines WL1. The second semiconductor device layer t2 of the three-dimensional semiconductor device includes multiple transistors T2, multiple memory cells R2, multiple bit lines BL2, multiple source lines SL2, and multiple word lines WL2. The third semiconductor device layer t3 includes multiple transistors T3, multiple memory cells R3, multiple bit lines BL3, multiple source lines SL3, and multiple word lines WL3. According to an embodiment of the disclosure, the ends of the bit lines BL1, BL2, BL3, the ends of the source lines SL1, SL2, SL3, and the ends of the word lines WL1, WL2, WL3 may have a stepped appearance.

Figure 6B:
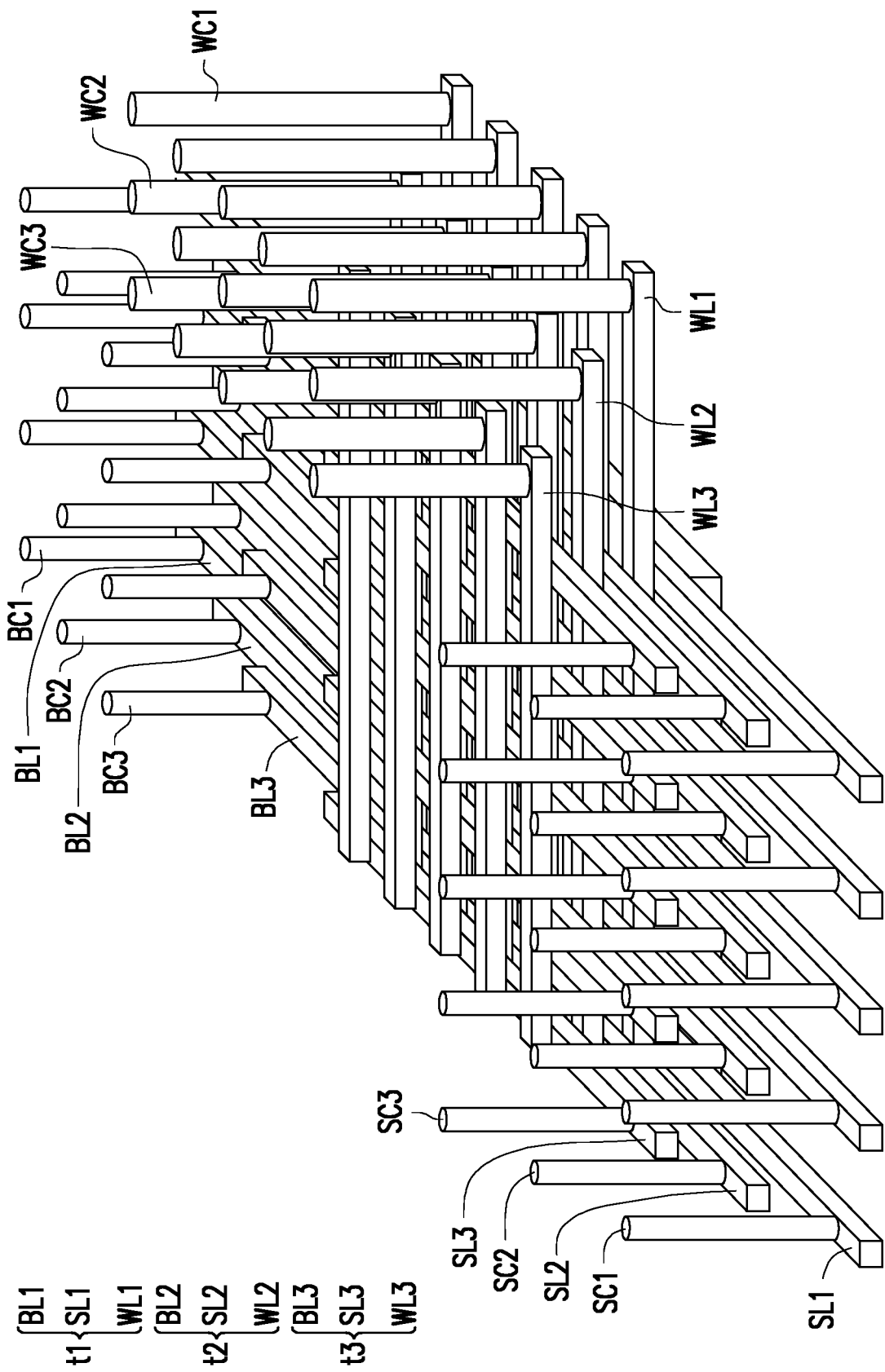

With reference to FIG. 6B, a bit line contact window BC1, a bit line contact window BC2, and a bit line contact window BC3 are formed at the ends of the bit lines BL1, BL2, and BL3, respectively. A source line contact SC1, a source line contact SC2, and a source line contact SC3 are formed at the ends of the source lines SL1, SL2, and SL3, respectively. A word line contact window WC1, a word line contact window WC2, and a word line contact window WC3 are formed at the ends of the word lines WL1, WL2, and WL3, respectively. Interconnection and other processes may be performed subsequently.

Figure 7A:
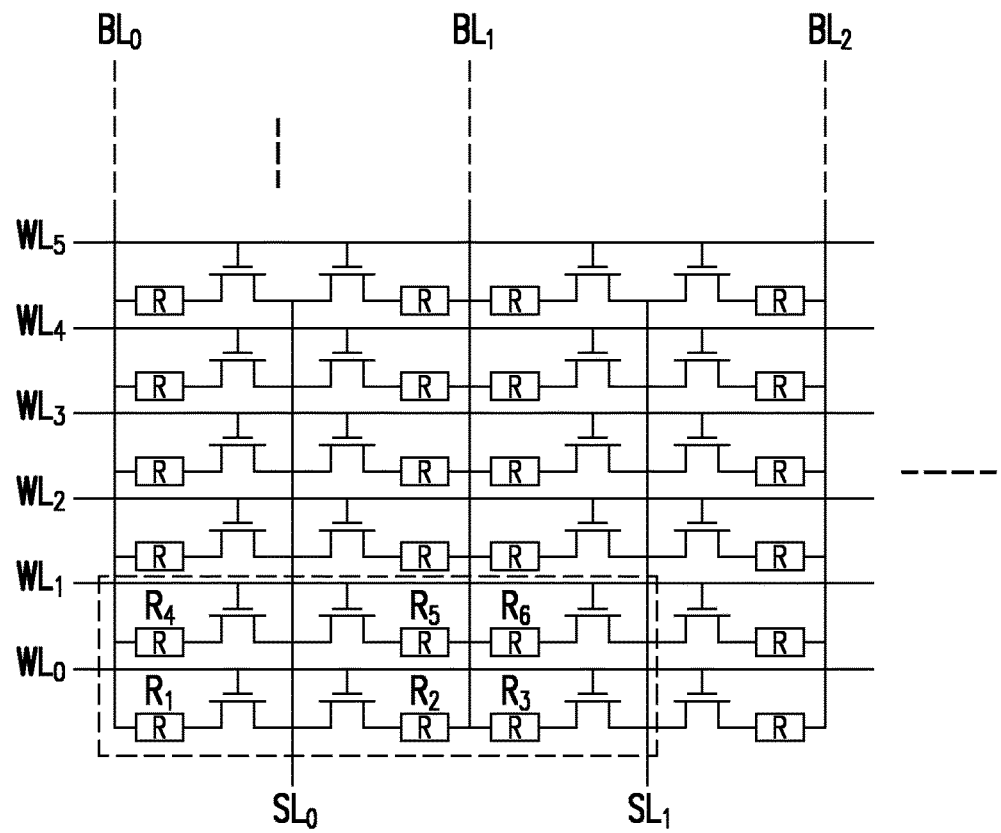
FIG. 7A is an equivalent circuit diagram of the first semiconductor device layer of the three-dimensional semiconductor device according to an embodiment of the disclosure.
Figure 7B:
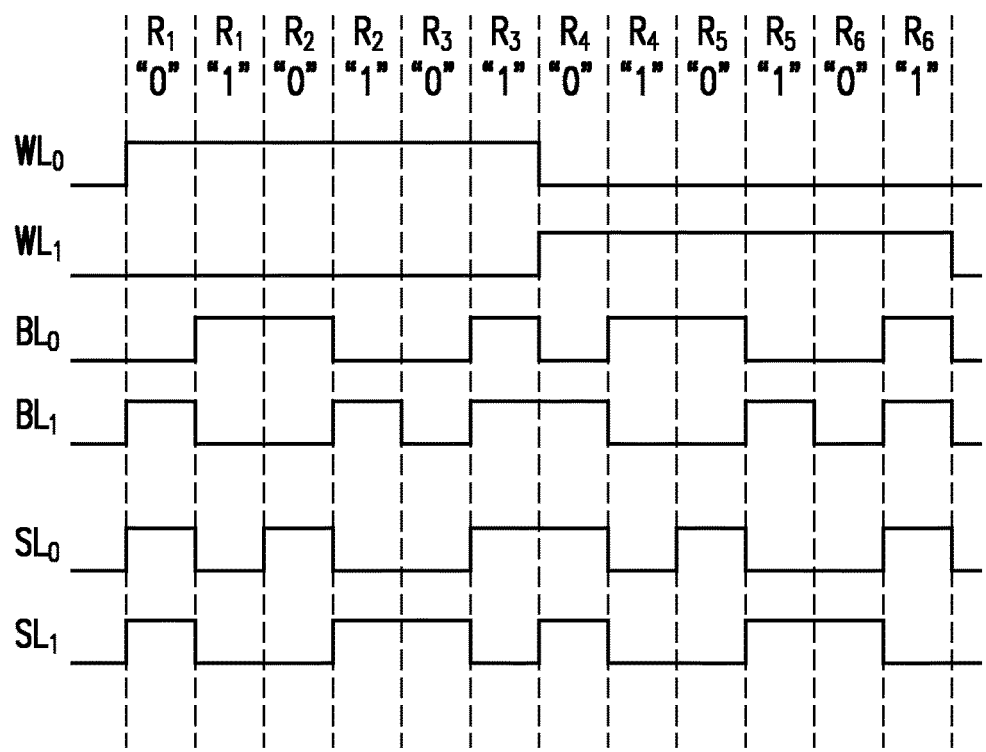
FIG. 7B is a schematic diagram of a part of the memory cell of the memory shown in FIG. 7A undergoing programming.

FIG. 7A is an equivalent circuit diagram of the first semiconductor device layer of the three-dimensional semiconductor device according to an embodiment of the disclosure. FIG. 7B is a schematic diagram of the memory shown in FIG. 7A undergoing programming.

With reference to FIGS. 7A, 7B and Table 1 below, when a memory cell R of the RRAM, such as $R_2$, is programmed to write data "0", voltage is applied to $WL_0$ to enable $WL_0$, while 0V is applied to other WL. A positive voltage is applied to $SL_0$, and 0V is applied to $BL_1$ and $SL_1$. Since the voltage of $SL_1$ is equal to the voltage of $BL_1$ (potential difference is 0), even though $WL_0$ is enabled, the memory cell $R_3$ is not programmed; therefore, the memory cell $R_2$ may be prevented from being interfered by the memory cell $R_3$. When the memory cell $R_2$ is programmed to write data "1", a programmed voltage is applied to $WL_0$ to enable $WL_0$, while 0V is applied to other WL and $SL_0$, and the same positive voltage is applied to $BL_1$ and $SL_1$. Since the voltage of $SL_1$ is equal to the voltage of $BL_1$ (potential difference is 0), even though $WL_0$ is enabled, the memory cell $R_3$ is not programmed; therefore, the memory cell $R_2$ may be prevented from being interfered by the memory cell $R_3$.

TABLE 1

| Programmed memory cell | Programmed data | $WL_0$ | $WL_1$ | $BL_0$ | $BL_1$ | $SL_0$ | $SL_1$ |
| --- | --- | --- | --- | --- | --- | --- | --- |
| $R_1$ | 0 | 1 | 0 | 0 | 1 | 1 | 1 |
| $R_1$ | 1 | 1 | 0 | 1 | 0 | 0 | 0 |
| $R_2$ | 0 | 1 | 0 | 0 | 1 | 0 | 1 |
| $R_2$ | 1 | 1 | 0 | 0 | 1 | 0 | 1 |
| $R_3$ | 0 | 1 | 0 | 0 | 0 | 0 | 0 |
| $R_3$ | 1 | 1 | 0 | 1 | 1 | 1 | 0 |
| $R_4$ | 0 | 0 | 1 | 0 | 1 | 1 | 1 |
| $R_4$ | 1 | 0 | 1 | 1 | 0 | 0 | 0 |

TABLE 1-continued

| Programmed memory cell | Programmed data | $WL_0$ | $WL_1$ | $BL_0$ | $BL_1$ | $SL_0$ | $SL_1$ |
| --- | --- | --- | --- | --- | --- | --- | --- |
| $R_5$ | 0 | 0 | 1 | 1 | 0 | 1 | 0 |
| $R_5$ | 1 | 0 | 1 | 0 | 1 | 0 | 1 |
| $R_6$ | 0 | 0 | 1 | 0 | 0 | 0 | 1 |
| $R_6$ | 1 | 0 | 1 | 1 | 1 | 1 | 0 |

Note: In $WL_0$, $WL_1$, $BL_0$, $BL_1$, $SL_0$ and $SL_1$, "1" means the application of a programmed voltage; "0" means the application of a 0V voltage.

With reference to FIG. 7A and Table 2 below, when the memory cell $R_2$ is read, a reading voltage is applied to $WL_0$ to enable $WL_0$, while 0V is applied to other WL and $SL_0$, and a reference voltage $V_{ref}$ (for example, 0.2V) is applied to $BL_1$ and $SL_1$. Since the voltage of $SL_1$ is equal to the voltage of $BL_1$ (potential difference is 0), even though $WL_0$ is enabled, the memory cell $R_3$ is not read; therefore, the memory cell $R_2$ may be prevented from being interfered by the memory cell $R_3$.

TABLE 2

| Read memory cell | $WL_0$ | $WL_1$ | $BL_0$ | $BL_1$ | $SL_0$ | $SL_1$ |
| --- | --- | --- | --- | --- | --- | --- |
| $R_1$ | 1 | 0 | $V_{ref}$ | 0 | 0 | 0 |
| $R_2$ | 1 | 0 | 0 | $V_{ref}$ | 0 | $V_{ref}$ |
| $R_3$ | 1 | 0 | $V_{ref}$ | $V_{ref}$ | $V_{ref}$ | 0 |
| $R_4$ | 0 | 1 | $V_{ref}$ | 0 | 0 | 0 |
| $R_5$ | 0 | 1 | 0 | $V_{ref}$ | 0 | $V_{ref}$ |
| $R_6$ | 0 | 1 | $V_{ref}$ | $V_{ref}$ | $V_{ref}$ | 0 |

Note: In $WL_0$, $WL_1$, $BL_0$, $BL_1$, $SL_0$ and $SL_1$, "1" means the application of the reading voltage; "0" means the application of a 0V voltage; "$V_{ref}$" means the application of the reference voltage.

In summary, in an embodiment of the disclosure, the three-dimensional semiconductor device has a stack of multiple semiconductor device layers, wherein each semiconductor device layer has multiple transistors with vertical channels and multiple RRAMs disposed beside the sidewalls of the gate structure. Each semiconductor device layer has a flat surface, making it easy to fabricate the next semiconductor device layer. Moreover, the memory element is a memory cell (1T1R), therefore avoiding the problem of sneak path.

What is claimed is:

1. A three-dimensional semiconductor device, comprising multiple semiconductor device layers on a substrate, wherein each of the semiconductor device layers comprises:
   a first transistor, comprising:
      a first stacked structure that is on the substrate, wherein the first stacked structure comprises a first insulating layer and a first gate conductor layer;
      a first gate dielectric layer surrounding a sidewall of the first stacked structure;
      a first semiconductor layer surrounding a sidewall of the first gate dielectric layer;
      a first channel layer that is in the first semiconductor layer; and
      a first source region and a first drain region that are on both sides of the first channel layer in the first semiconductor layer; and
   a first resistive random access memory cell that is on a first sidewall of the first semiconductor layer of the first transistor and connected to the first drain region.

2. The three-dimensional semiconductor device according to claim 1, wherein each of the semiconductor device layers further comprises:
- a second transistor comprising:
  - the first stacked structure;
  - a second channel layer that is in the first semiconductor layer and is disposed corresponding to the first channel layer, wherein the first stacked structure is between the first channel layer and the second channel layer; and
  - a second source region and a second drain region that are on both sides of the second channel layer in the first semiconductor layer; and
- a second resistive random access memory cell that is on a second sidewall of the first semiconductor layer and is connected to the second drain region.

3. The three-dimensional semiconductor device according to claim 2, wherein a first electrode of the first resistive random access memory cell is in contact with a sidewall of the first drain region, and a first electrode of the second resistive random access memory cell is in contact with a sidewall of the second drain region.

4. The three-dimensional semiconductor device according to claim 2, wherein each of the semiconductor device layers further comprises:
- a third transistor and a fourth transistor, comprising:
  - a second stacked structure that is on the substrate, and adjacent to the first stacked structure;
  - a second gate dielectric layer surrounding a sidewall of the second stacked structure;
  - a second semiconductor layer surrounding a sidewall of the second gate dielectric layer;
  - a third channel layer and a fourth channel layer that are in the second semiconductor layer;
  - a third source region and a third drain region that are on both sides of the third channel layer in the second semiconductor layer; and
  - a fourth source region and a fourth drain region that are on both sides of the fourth channel layer in the second semiconductor layer;
- a third resistive random access memory cell that is on a first sidewall of the second semiconductor layer; and
- a fourth resistive random access memory cell that is on a second sidewall of the second semiconductor layer.

5. The three-dimensional semiconductor device according to claim 4, wherein each of the semiconductor device layers further comprises a word line that is electrically connected to the first gate conductor layer of the first stacked structure and a second gate conductor layer of the second stacked structure.

6. The three-dimensional semiconductor device according to claim 4, wherein each of the semiconductor device layers further comprises a bit line that is between the first semiconductor layer and the second semiconductor layer, and electrically connected to a plurality of second electrodes of the first, second, third, and fourth resistive random access memory cells.

7. The three-dimensional semiconductor device according to claim 4, wherein each of the semiconductor device layers further comprises:
- a first source line that is electrically connected to the first source region and the second source region in the first semiconductor layer; and
- a second source line that is electrically connected to the third source region and the fourth source region in the second semiconductor layer.

8. A method of fabricating a three-dimensional semiconductor device, comprising forming multiple semiconductor device layers on a substrate, wherein forming each of the semiconductor device layers comprises:
- forming a first transistor, comprising:
  - forming a first stacked structure on the substrate, wherein the first stacked structure comprises a first insulating layer and a first gate conductor layer;
  - forming a first gate dielectric layer surrounding a sidewall of the first stacked structure;
  - forming a first semiconductor layer surrounding a sidewall of the first gate dielectric layer; and
  - forming a first source region and a first drain region in the first semiconductor layer, wherein a first channel layer is defined as between the first source region and the first drain region; and
- forming a first resistive random access memory cell on a first sidewall of the first semiconductor layer and connected to the first drain region.

9. The method of fabricating the three-dimensional semiconductor device according to claim 8, wherein forming each of the semiconductor device layers further comprises:
- forming a second transistor, comprising:
  - forming a second channel layer in the first semiconductor layer, which is disposed corresponding to the first channel layer, wherein the first stacked structure is between the first channel layer and the second channel layer; and
  - forming a second source region and a second drain region that are on both sides of the second channel layer in the first semiconductor layer; and
- forming a second resistive random access memory cell on a second sidewall of the first semiconductor layer and connected to the second drain region.

10. The method of fabricating the three-dimensional semiconductor device according to claim 9, wherein a first electrode of the first resistive random access memory cell is in contact with a sidewall of the first drain region, and a first electrode of the second resistive random access memory cell is in contact with a sidewall of the second drain region.

11. The method of fabricating the three-dimensional semiconductor device according to claim 9, wherein forming each of the semiconductor device layers further comprises:
- forming a third transistor and a fourth transistor, comprising:
  - forming a second stacked structure on the substrate and adjacent to the first stacked structure;
  - forming a second gate dielectric layer surrounding a sidewall of the second stacked structure;
  - forming a second semiconductor layer surrounding a sidewall of the second gate dielectric layer;
  - forming a third channel layer and a fourth channel layer in the second semiconductor layer;
  - forming a third source region and a third drain region on both sides of the third channel layer in the second semiconductor layer; and
  - forming a fourth source region and a fourth drain region on both sides of the fourth channel layer in the second semiconductor layer;
- forming a third resistive random access memory cell on a first sidewall of the second semiconductor layer; and
- forming a fourth resistive random access memory cell on a second sidewall of the second semiconductor layer.

12. The method of fabricating the three-dimensional semiconductor device according to claim 11, wherein forming each of the semiconductor device layers further comprises forming a word line that is electrically connected to the first gate conductor layer of the first stacked structure and a second gate conductor layer of the second stacked structure.

13. The method of fabricating the three-dimensional semiconductor device according to claim 11, wherein forming each of the semiconductor device layers further comprises forming a bit line between the first semiconductor layer and the second semiconductor layer, the bit line being electrically connected to a plurality of second electrodes of the first, second, third, and fourth resistive random access memory cells.

14. The method of fabricating the three-dimensional semiconductor device according to claim 11, wherein forming each of the semiconductor device layers further comprises:
    forming a first source line that is electrically connected to the first source region and the second source region in the first semiconductor layer; and
    forming a second source line that is electrically connected to the third source region and the fourth source region in the second semiconductor layer.

\* \* \* \* \*